United States Patent [19]
Trager et al.

[11] Patent Number: 5,592,403
[45] Date of Patent: Jan. 7, 1997

[54] DIGITAL-TO-ANALOG CONVERTER INCLUDING INTEGRAL DIGITAL AUDIO FILTER

[75] Inventors: David S. Trager; Akhtar Ali; Frederick J. Highton; Kun Lin, all of Tucson, Ariz.

[73] Assignee: Monolith Technologies Corporation, Tucson, Ariz.

[21] Appl. No.: 29,870

[22] Filed: Mar. 11, 1993

(Under 37 CFR 1.47)

[51] Int. Cl.$^6$ .................................................... G06F 17/10
[52] U.S. Cl. .................................................... 364/724.01
[58] Field of Search ........................... 364/724.01, 724.1, 364/724.16, 723, 757, 758, 759, 784, 786

[56] References Cited

U.S. PATENT DOCUMENTS

| | | | |
|---|---|---|---|
| 3,979,701 | 9/1976 | Tomozawa | 333/166 |
| 4,615,026 | 9/1986 | Schiff | 364/724.16 |
| 4,746,899 | 5/1988 | Swanson et al. | 341/122 |
| 4,782,458 | 11/1988 | Bhattacharya et al. | 364/724.16 |
| 5,087,914 | 2/1992 | Sooch et al. | 341/120 |
| 5,214,676 | 5/1993 | Wilkinson | 364/724.1 |
| 5,327,459 | 7/1994 | Hara et al. | 364/724.16 |

OTHER PUBLICATIONS

Kato et al., "Digital Video Signal Processing in Home VTRs", IEEE Transactions on Consumer Electronics, vol. CE–32, No. 3, 1986, pp. 372–378.
Pak K. Chan and Martine D. F. Schlag, "Analysis and Design of CMOS Manchester Adders with Variable Carry–Skip", IEEE Trans on Comp., vol. 39, No. 8, pp. 983–992, 1990.

Primary Examiner—Roy N. Envall, Jr.
Assistant Examiner—Chuong D. Ngo
Attorney, Agent, or Firm—Snell & Wilmer

[57] ABSTRACT

A digital signal processor (DSP) circuit is configured to recursively retrieve and process pairs of data points in a symmetric digital filter. The data points are retrieved from an external source (e.g., compact disk) at a first frequency, and processed within the DSP at a second frequency. The DSP employs a floating pointer scheme, which effectively functions a buffer to thereby compensate for jitter or drift between the first and second frequencies.

1 Claim, 11 Drawing Sheets

DIGITAL-TO-ANALOG CONVERTER INCLUDING INTEGRAL DIGITAL AUDIO FILTER

TECHNICAL FIELD

The present invention relates, generally, to digital-to-analog converters for use in connection with audio playback systems, and more particularly to integrated digital oversampling interpolation filters.

BACKGROUND ART AND TECHNICAL PROBLEMS

Presently known digital-to-analog converters ("DACs" or "D/A converters") for use in digital audio systems are configured to perform a variety of signal processing functions. For example, the CMOS LSI ΣDECO SM5871AS digital audio D/A converter manufactured by Nippon Precision Circuits Ltd. ("NPC") inputs digital data from a compact disc at a predetermined sample frequency Fs, and processes the data using the following functional modules: an infinite impulse response ("IIR") de-emphasis filter; a digital attenuator; an 8× oversampling filter; a sigma-delta (Δ-Σ) modulator (noise shaper); and a pulse width modulator (PWM). The pulse width modulated output of the D/A converter may then be low-pass filtered, amplified and applied to a conventional audio speaker to generate sound reproduction of the digital data. The three 2× interpolation stages may be selectively configured as a single stage (2×), a two stage (2×2×)=4×, or a three stage (2×2×2×)=8× oversampling digital filter, to ultimately effect a desired degree of interpolation (oversampling) of the input data. For an 8× interpolating filter, the interpolated data is applied to the Δ-Σ modulator at a frequency of 8 Fs.

In the NPC D/A converter, the Δ-Σ modulator functionally comprises an initial sample and hold module, followed by a noise shaping module. Such sample and hold modules typically effect additional oversampling, for example 4× interpolation. The resulting output from the Δ-Σ modulator comprises a 32× interpolation of the original input data at a frequency of 32 Fs. The noise shaping module is configured to effectively shift the quantization noise introduced in the Δ-Σ modulation into high frequency regions beyond the audible range. The output of the noise shaping module is applied to a pulse width modulator and low-pass filter to produce an analog signal, which is thereafter ultimately applied to an audio transducer to generate sound reproduction of the input data.

In many audio applications, it is common to either simultaneously or sequentially process two or more channels of data (e.g., left and right channel data) for simultaneous reproduction at an audio transducer. That is, a single input data word, for example a left channel data word, may have a corresponding right channel data word associated therewith. For clarity and to facilitate this discussion, the processing of a single data word will be described, it being understood that one or more additional data words (corresponding to additional channels) may also be concomitantly processed for each data word discussed herein.

The processing of digital data in the context of audio systems typically involves sequentially retrieving data words from a data storage location, for example from Read Only Memory (ROM) such as a compact disc (CD). In the context of digital audio reproduction, the well-known Nyquist theorem teaches selecting an input data sample rate which is at least twice the frequency of the highest frequency audible tones. Thus, digital data corresponding to audio signals is typically stored in ROM, in 2's complement format, at a predetermined input sample rate, typically 32.0, 44.1, or 48.0 kHz. As a result of the application of the Nyquist theorem in the context of the compact disc industry wherein the upper range of audible frequencies is generally about 20 kHz, a 44.1 kHz input sample rate (Fs) has emerged as the industry standard.

Presently known CD digital audio play-back systems are often configured to operate at conventional sample rates, for example 44.1 kHz. That is, a single data point is retrieved from ROM during each sample period, each sample period having a duration of 1/44.1 kHz=22.7 microseconds. During each sample period, one complete processing sequence is executed.

The processing of data within a typical D/A converter is governed by a system clock associated with and generally resident within the D/A converter. All aspects of data flow and data manipulation within the converter are typically controlled and synchronized by this system clock. The inputting of input data words from ROM into the D/A converter, on the other hand, is typically controlled by a word clock which is typically not resident on the D/A converter device; rather, the word clock is generally resident in the CD player data retrieved (read head) circuitry.

The word clock generally controls and synchronizes the retrieval of data from CD ROM and the transmission of the input data to the D/A converter. More particularly, the word clock governs the application of input data to an input data interface associated with typical D/A converters. While the period of the system processing (sampling) cycle established by the system clock and the data retrieval period, i.e., the period of the word clock, are ideally coincident, variations between the period of the system processing (sampling) cycle and the period of the word clock are often encountered. These variations (sometimes referred to as "jitter") may become excessive when accumulated over time, causing the word clock to creep with respect to the system cycle, resulting in the disruption of input data flow into the processing modules. Specifically, if the word clock exhibits a period greater than the period of the system cycle, it is possible that the D/A converter may be "ready" to begin processing the next input data word before that input data word has been acquired at the input data interface. Conversely, if the word clock exhibits a period of shorter duration than the period of the system clock, it is possible for an input data word to arrive at the input data interface at a faster rate than the input can be processed in accordance with the (slower) system cycle. In either case, the flow of data is disrupted. Moreover, excessive jitter can degrade the fidelity of the reproduced audio signal.

The processing of digital audio data typically involves a technique known as filtering, Wherein input data is sampled at a sampling frequency Fs, and thereafter interpolated to produce oversampled data at a frequency which is an integer multiple of Fs.

More particularly, a 2× interpolation filter typically calculates the value of a new data point midway between each sampled (input) data point, resulting in a stream of data points at a frequency of 2 Fs. One well known technique for performing such interpolation involves multiplying a plurality of input data words by respective predetermined coefficients, and summing the series of products to produce a single interpolated value. The number of data points/coefficients employed in the multiplication/summation operation is referred to as the number of "taps" employed in the filter. Generally, the number of taps within a particular filter stage is proportional to the accuracy with which the magnitude of an interpolated data point may be determined; a larger number of taps yields a more accurate interpolated value. The existence of powerful and mature optimization techniques for determining the value ("weight") of each coefficient permits such filters to be tuned to a high degree of precision.

For an nX interpolation filter, where "n" is any positive integer, a total of n output data points are produced for each input data point. Computational complexity may be reduced by selecting $n=2^p$, where "p" is any positive integer, such that n=2, 4, 8, etc. In this way, any filter may be implemented as a succession of 2× stages; for example, an 8× filter may be implemented as a succession of three 2× filters, where the output of the first stage 2× filter is used as the input for the second stage 2× filter, and the output of the second stage filter comprises the input for the third stage 2× filter. Such a multi-staged filter is advantageous in that a single stage implementation (e.g., 8×) requires a filter of substantially higher order than a multistage filter (e.g., 2×2×2×) effecting the same interpolation.

Computational complexity may also be reduced by employing a symmetrical half band filter, i.e., a filter having an impulse response characteristic which is symmetric about Fs/4. In a symmetrical half band filter nearly one-half of its impulse responses are zero valued (one-half minus one of the taps (every other tap) have a zero valued coefficient and a zero valued data point, and one of the taps has a value of unity), thereby eliminating the need for approximately one-half the number of multiplications for a filter having a given number of taps. Moreover, selecting the coefficient values to be symmetric about the interpolated data point permits two symmetrically disposed data points to be added together and thereafter multiplied by a single coefficient, further reducing the total number of unique non-zero coefficients to t/4 for a filter having "t" taps.

For example, a conventional 2× interpolation filter may comprise a total of, e.g., seventy-five (75) taps. For a symmetrical half band filter, thirty-six of these taps have a coefficient value of zero and one has a coefficient value of unity (one). The remaining thirty-eight taps are symmetrically disposed about the interpolated value; hence, only 19 unique non-zero coefficients are required to perform the seventy-five tap interpolation. 2× interpolation filters may be cascaded to effect, for example, 4×, 8×, and higher resolution interpolation, as desired.

In the context of the aforementioned NPC device, 8× interpolated data is further processed (oversampled) by a 4× sample and hold module resulting in, for example, 32× oversampled data at a frequency of 32 Fs. More particularly, input data is typically retrieved from ROM in words of a predetermined length, typically 16-, 18- or 20-bit format at a frequency of Fs. The 8× interpolated data enters the sample and hold module in units of 16- to 20-bit format at 8 Fs. The 16- to 20-bit 4× oversampled data from the sample and hold module (resulting in a total of 32× oversampling) is applied to the Δ-Σ modulator at 32 Fs. The Δ-Σ modulator requantizes the data and outputs the data in a 4-bit format at 32 Fs. Thus, the sample and hold circuit and Δ-Σ modulator cooperate to convert, e.g., 16-bit data at 8 Fs to 4-bit data at 32 Fs. The resulting 32× oversampled data thus comprises the original input data from ROM interleaved with 8× interpolated data and 4× sample and hold data.

Presently known audio filters are disadvantageous in several respects. For example, although the system cycle (internal to the filter) and the word clock (external to the filter) are intended to operate in synchrony, the actual period of the word clock tends to exhibit some degree of jitter with respect to the actual period of the filter system cycle. Excessive jitter often results in reduced quality in the reproduced sound.

Presently known digital filters often employ multiplier-accumulator based filtering schemes which utilize a hardware multiplier to multiply the various data points by their corresponding filter coefficients. Some systems may also employ a separate multiplier for each channel; the use of dual multipliers permits parallel processing of left and right channel data. While multiplier-accumulator based processing is often more time efficient than shift-and-add processing (i.e., a single multiplication is carried out in few clock cycles), multiplier-accumulator based processing is generally more "real estate" intensive, i.e., occupies a larger region on an integrated circuit, than shift-and-add processing. Thus, the use of multiplier-accumulator based processing may be disadvantageous in circumstances where the physical size of the processing circuitry is a critical design limitation.

A digital audio filter is needed which overcomes the disadvantages of the prior art.

SUMMARY OF THE INVENTION

The D/A converter of the present invention provides significant advantages over presently known D/A converters.

In accordance with one aspect of the present invention, digital filtering is implemented in a shift-and-add circuit in a manner which greatly reduces computational complexity vis-à-vis presently known digital filters employing multiplier-accumulator based architectures.

In accordance with a further aspect of the present invention, input data is retrieved from ROM and stored in an input buffer; the data is subsequently retrieved from the input buffer for processing in a manner which effectively isolates the processing circuitry from any relative jitter between the system cycle and the word clock.

In accordance with a further aspect of the present invention, a three-stage cascaded 2× filter scheme is employed, resulting in 8× interpolation. Moreover, a polyphase scheme is conveniently employed in a preferred embodiment, wherein each filter stage computes an interpolated data point during a phase one operation, and simply "passes through" a raw data point to the next stage during a phase two operation. More particularly, the precise order in which phases one and two of the various filter stages are effected in a manner which permits the filter to output the interpolated data in proper sequential order.

In accordance with a further aspect of the invention, a rolling, inside-out pointer scheme is employed which facilitates the flow of data through the digital filter with minimum computational complexity. In particular, once a particular data point is written into either the first, second, or third stage memory, it need not be thereafter moved within a particular stage's memory; rather, a novel addressing scheme is employed to simulate the rotation of data within memory.

In accordance with a further aspect of the invention, a digital attenuation scheme is employed in the context of a shift-and-add algorithm. In a particularly preferred embodiment, conventional attenuation control signals are recoded to facilitate implementation of the shift-and-add algorithm with minimal computational complexity.

In accordance with yet another aspect of the invention, a binary adder is provided which generates binary sums in a highly efficient manner by effectively reducing the time required to propagate carry bits forward.

BRIEF DESCRIPTION OF THE DRAWING

The present invention will hereinafter be discussed in conjunction with the appended drawing figures, wherein like numerals denote like elements.

DETAILED DESCRIPTION OF PREFERRED EXEMPLARY EMBODIMENTS

Figure 1:
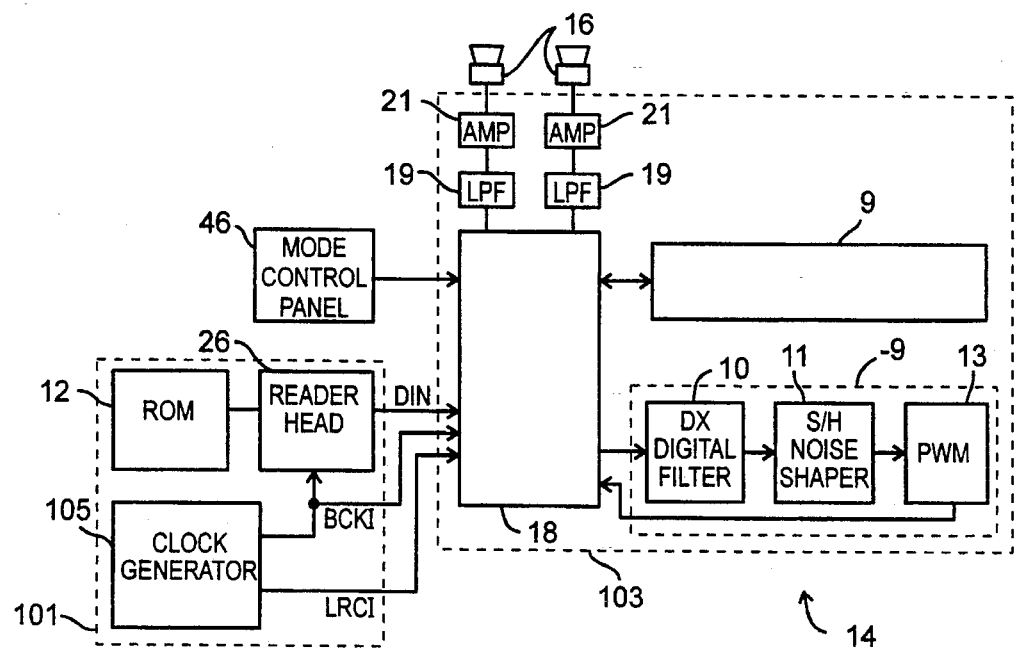
FIG. 1 is a functional block diagram of a digital audio playback system including an audio data source (ROM), digital-to-analog converter (DAC), and analog output.

Referring now to FIG. 1, the various aspects of the present invention are particularly useful in processing digital audio data, for example, in the context of a compact disk (CD) player 14. CD player 14 suitably comprises a conventional data retrieval mechanism 101, a digital signal processing (DSP) module 103, and a mode control panel 46.

Data retrieval mechanism 101 suitably comprises a conventional reader/head 26 and clock signal generator 105. Head 26 retrieves digital audio data from a suitable read only memory (ROM), e.g. CD 12, in accordance with a bit clock signal BCKI (frequency nFs, where n is the word bit length) in a conventional manner, and inputs digital audio data at frequency Fs to DSP 103 for processing.

DSP 103 suitably acquires the data from each audio channel, then performs digital to analog conversion upon the data from each channel in parallel. Conceptually, DSP 103 suitably comprises respective functional modules; an interface 18; a digital-to-analog converter (DAC) 9 for each audio channel, each DAC 9 functionally comprising a digital filter 10; a sample and hold noise shaper module 11; and a Pulse Width Modulator (PWM) 13. If desired, a low pass filter 19 and amplifier 21 functions may also be effected in DSP module 103. The output signals from DSP 103 are applied to suitable transducers for audio reproduction, for example conventional audio speakers 16. The various digital signal processing functions of DACs 9 are preferably performed by common circuitry, as will hereinafter be described in conjunction with FIG. 2. However, if desired, the respective processes may be effected employing separate functional modules; for ease of explanation, DSP 103 will initially be so described.

In accordance with one aspect of the present invention, as will hereinafter be explained, the DAC function preferably operates asynchronously from data retrieval module 101; interface 18 buffers the input data to effectively isolate DSP 103 from any variance (e.g., jitter or creep) between the data retrieval clock signals (BCKI, or derived word clock signal LRCI), and the clock signal employed to effect operation of DSP module 103.

Digital filter 10 is suitably an interpolating filter which outputs interpolated data at a frequency of nFs, where n is an interpolation factor chosen through mode control 46, suitably 4× or 8×. In accordance with one aspect of the present invention, filter 10 is implemented employing shift-and-add circuitry as described in conjunction with FIG. 6, and preferably employing a particularly fast adder, as will be described in conjunction with FIGS. 16A–C.

Sample and hold noise shaper 11 is suitably a sigma-delta ($\Sigma$-$\Delta$) modulator which further oversamples (interpolates) the data to a frequency equal to a predetermined multiple of Fs, e.g., 8 Fs. In accordance with one aspect of the present invention, noise shaper 11 quantizes the data to on the order of 3- or 4-bits, and applies the data to PWM 13 at, e.g., 48 Fs. Proper selection of the filter coefficients comprising noise shaper 11 effectively shifts the quantization noise to high frequencies, for example out of the audible range.

PWM 13 converts the 48 Fs digital data to a corresponding analog signal. In accordance with one aspect of the present invention, PWM 13 converts the output of noise shaper 11 to an analog audio signal which is applied to low pass filter 19 and amplifier 21, and ultimately to transducer 16 for sound reproduction.

Preferred embodiments of noise shaper 11 and PWM 13 are described in the commonly owned and co-pending U.S. patent application entitled "Methods and Apparatus for the Quantization and Analog Conversion of Digital Signals", filed concurrently herewith.

Figure 2A:
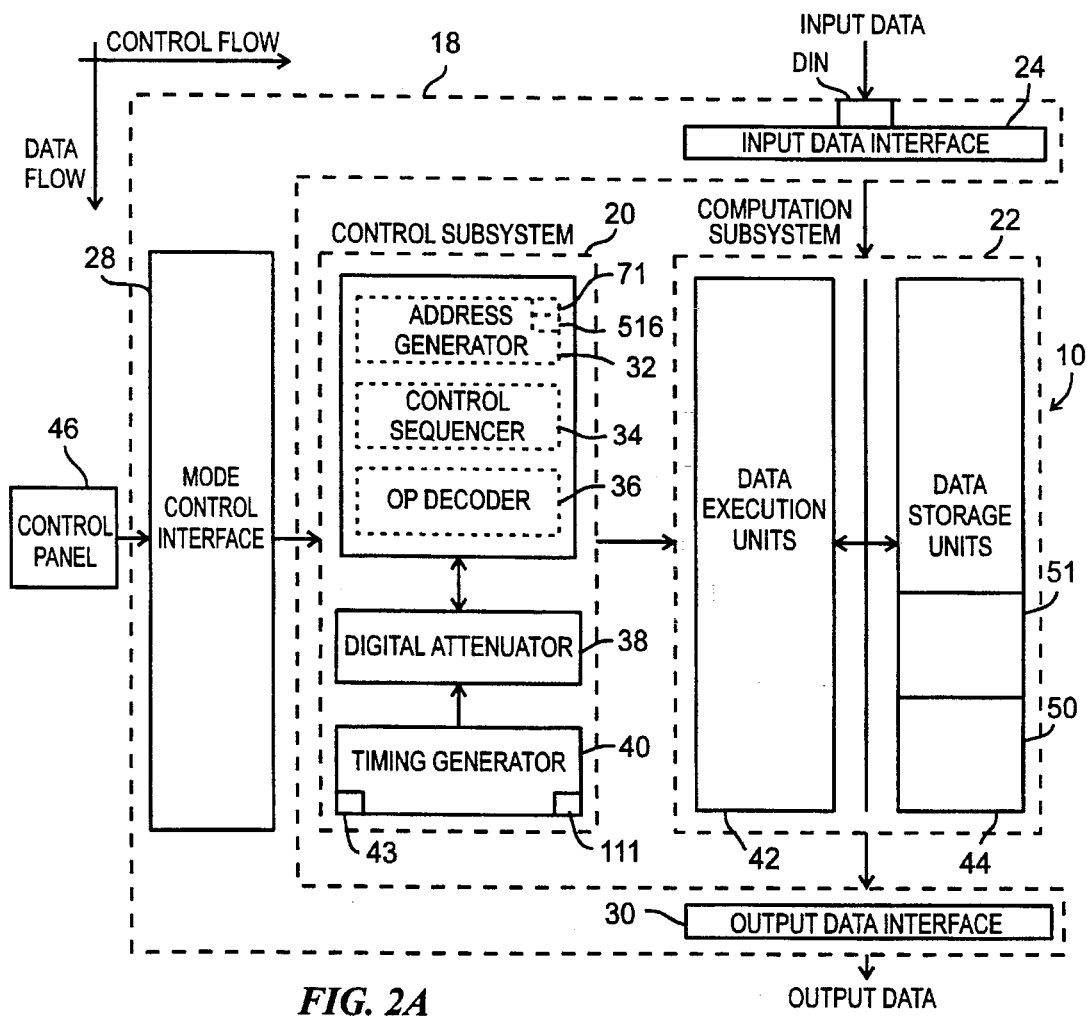
FIG. 2A is a functional block diagram of the DAC portion of the playback system of FIG. 1, detailing the various control and data subsystems.
Figure 2B:
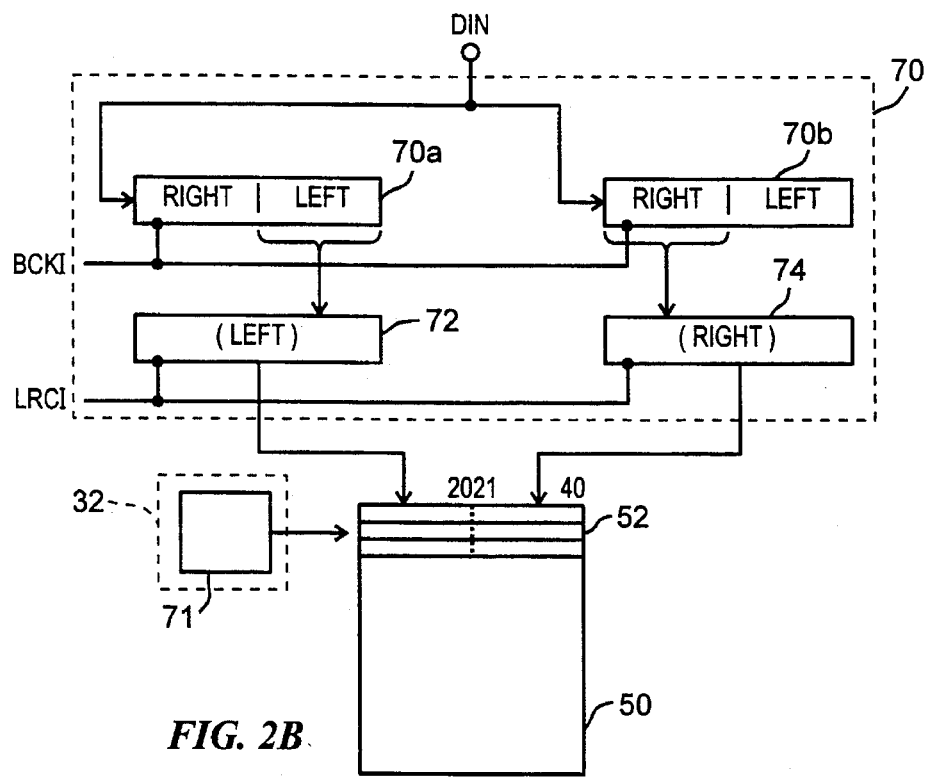
FIG. 2B is a block diagram detailing the input data interface portion of the DAC functional diagram shown in FIG. 2A.
Figure 3:
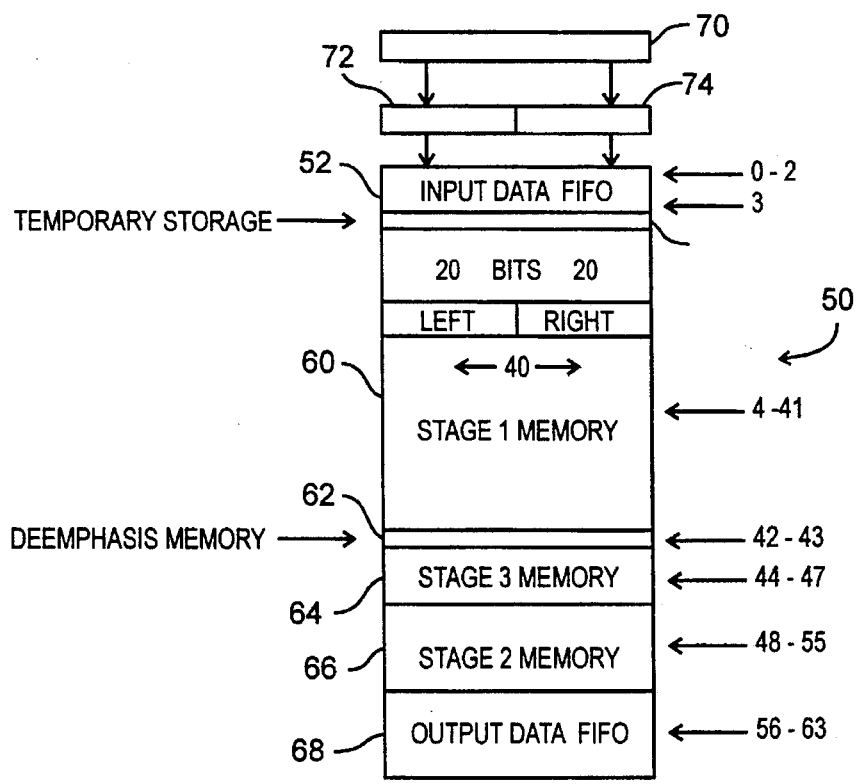
FIG. 3 is a block diagram detailing the data storage unit of FIG. 2A.

In the preferred embodiment shown in FIGS. 1–3, groups of successive input data words from CD 12 represent corresponding data for respective individual channels, e.g., a two word group constituted by a data word from a right channel followed by the corresponding data word from a left channel, for example, corresponding to left and right stereo speakers. In the preferred embodiment, a nominal single composite data word is employed, namely, a single (e.g., 40-bit) word comprising a separate (e.g., 20-bit) data field for each channel.

The digital signal processing function of DACs 9 are preferably implemented in DSP 103 employing circuitry that is common to the various signal processing functions of the respective DACs 9 and common to the respective channels; the amount of channel-specific circuitry is to a great extent minimized. Referring to FIG. 2A; DSP 103 suitably comprises interface, control, and computation subsystems 18, 20, and 22, respectively.

Interface subsystem 18 provides input/output interfacing for DSP 103, e.g., effects interfacing between DSP 103, head 26, and output units (e.g., low pass filter 19, amplifier 21, speaker 16). Interface subsystem 18 advantageously comprises input data, mode control, and output data interfaces 24, 28 and 30, respectively: input data interface 24 is disposed to receive digital data words from read head 26 and apply the data to computation subsystem 22; mode control interface 28 is disposed to cooperate with mode control panel 46 to effect various user controlled functions (e.g., attenuation, discussed more fully in connection with FIG. 13); and output data interface 30 is disposed to receive processed data from computation subsystem 22 and apply it to, for example, subsequent processing modules or to speaker 16.

Control subsystem 20 generates the control signals to effect the various signal processing functions. Control subsystem 20 suitably comprises an address generator 32, a control sequencer 34 (containing a predetermined sequence of microcode instructions), an op decoder 36 (for generating control signals in accordance with the microcode instructions), a digital attenuator 38, and a timing generator 40. Timing generator 40 includes a control circuit 41 and a system clock 43, the functions of which are variously discussed below in conjunction with, inter alia, FIG. 5.

Computation subsystem 22, responsive to control signals from control subsystem 20, acquires and operates upon the data retrieved from ROM 12 to effect the desired digital signal processing. Computation subsystem 22 suitably comprises a data execution unit 42 and a data storage unit 44. Data execution unit 42 suitably comprises a respective shift and add circuit corresponding to each audio data channel as discussed in greater detail in conjunction with FIG. 6. Storage unit 44 includes a data RAM 50 and a coefficient ROM 51.

RAM 50 suitably includes a plurality, e.g., sixty-four, of locations of addressable memory (locations 0–63), each location including a sufficient number of bits to accommodate the corresponding data from all of the respective channels. As illustrated in FIG. 3, RAM 50 is operatively configured as an input data FIFO 52 (locations 0–2), a temporary storage register 54 (location 3), a stage one memory sector 60 (locations 4–41), a de-emphasis memory sector 62 (locations 42–43), a stage three memory sector 64 (locations 48–55), a stage two memory sector 66 (locations 48–55), and an output data FIFO 68 (locations 56–63). RAM 50 will be discussed more fully in connection with FIGS. 3, 6, and 9.

Filter 10, implemented through control and computation subsystems 20 and 22, may operate in a variety of different modes in accordance with user-selected parameters established through mode control interface 28. Conceptually, filter 10 executes (i.e., the filter function is effected through execution of) a predetermined sequence of microcode instructions resident within control sequencer 34 in accordance with the particular operating configuration determined by mode control interface 28. The number of clock pulses of system clock 43 required to effect one complete sequence of microcode instructions (cycle of operation) of filter 10 is referred to as a sample period P. In general, in effecting the microcode sequence, filter 10 acquires an input data word from ROM 12, performs an nX interpolation specified by mode control 28 (e.g., 8×), and outputs a total of n data points (1 data point corresponding to an original input data word and n−1 (e.g., 7) data points corresponding to interpolated values) during each sample period. For example, if filter 10 is configured to operate as a 4× interpolating filter, the sample period may comprise, for example, 256 system clock pulses. In the illustrated embodiment, wherein filter 10 is configured to operate as an 8× interpolating filter, the sample period suitably comprises, e.g., 384 system clock pulses.

Referring now to FIGS. 1–3, head 26 successively reads prerecorded input data words from CD 12 in accordance with bit clock BCKI (frequency Fs) and inputs them serially into input data interface 24. Input data interface 24 is a fully asynchronous system; it does not operate synchronously with the rest of filter 10. Rather, input data interface 26 functions synchronously with CD player 14. As discussed below, input data interface 26 loads the data into FIFO 52 in RAM 50 of data storage unit 44. Input FIFO 52 effectively functions as a buffer, allowing DSP 103 to operate in a free running mode (i.e., asynchronously with respect to CD player 14 and input data interface 26), thereby substantially isolating DSP 103 from any jitter exhibited by the word clock.

Input data words stored in ROM 12 are of a predetermined bit length, typically in a 16, 18, or 20 bit format, with groups of successive words reflecting corresponding data from the respective channels. In the preferred embodiment of the present invention, the respective channel data words are retrieved from ROM 12 in sequence forming a composite word of 40 bits. More specifically, the data from CD 12 is read serially by head 26, and a composite data word acquired in input data interface 24. The acquired words of data are thereafter loaded into FIFO 52 in data RAM 50. Data execution unit 42 retrieves the data from input FIFO 52, processes the data (i.e., performs the filtering/interpolating functions) and ultimately writes the resulting data into output FIFO 68 for subsequent application to noise shaper 11, PWM 13 (i.e., for submission to the noise shaping and pulse width modulation functions effected by control and computation subsystems 20 and 22), and thereafter to transducer 16.

Referring now to FIG. 2B, input data interface 24 suitably comprises: an input data pin DIN receptive of serial data from head 26; a respective shift register and buffer register corresponding to each channel, e.g., left and right shift registers 70a and 70b, and respective left and right buffer registers 72 and 74.

Figure 4:
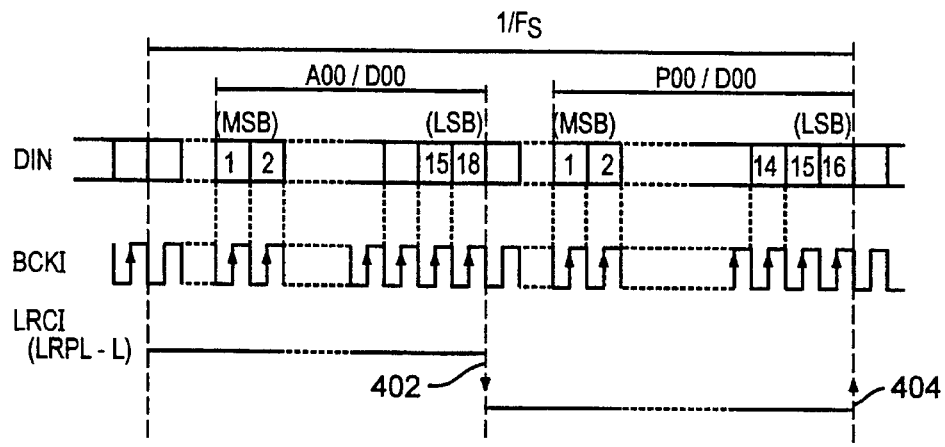
FIG. 4 is a graphical representation of the temporal relationships of the three digital inputs to the DAC input data interface of FIG. 2B.

Head 26 reads the data on CD 12 serially, in accordance with data retrieval bit clock BCKI (see wave form in FIG. 4). The serial data is applied to interface 24 at input pin DIN. Each bit received at pin DIN is simultaneously clocked into left and right buffer registers 70a and 70b in serial fashion, simultaneously shifted into shift registers 70a and 70b on the rising edge of the BCKI bit clock. (Shift registers 70a and 70b may be physically displaced from each other in the integrated circuit.) Word clock LRCI, generated by clock generator 105 in data retrieval mechanism 101 (derived from bit clock BCKI), is indicative of retrieval of a complete word from CD 12 (and hence acquisition of a complete word in shift register 70).

When shift registers 70 are full, i.e., when the entire composite input data word has been acquired, word clock LRCI goes from low to high (FIG. 4, point 404). The high going transition in LRCI is employed to effect parallel latching of the left and right channel fields of the input data word into input register 72 and input register 74, respectively. Thereafter, the contents of input registers 72 and 74 are parallel latched into an associated field (e.g., into either left channel bits 1–20 or right channel bits 21–40) of a designated location in input data FIFO 52 in accordance with the contents of a counter 71 (discussed in greater detail below). The addressing scheme for determining which line in FIFO 52 the data is latched into is discussed more fully below in conjunction with FIG. 7.

Thus, at the end of a data word cycle, a composite data word reflecting the corresponding data from each of the respective channels has been loaded into the designated location in FIFO 52.

Address generator 32 suitably includes a modulo 3 up-counter 71 which is incremented in accordance with each cycle of word clock LRCI. Up-counter 71 provides a rolling pointer, establishing the address of the location in FIFO 52 into which input data words retrieved from ROM 12 are written. The address of the input FIFO location is varied in a predetermined sequence to simulate shifting of data words through a FIFO stack, without actually shifting the data from location to location. Data is successively loaded into, e.g., FIFO 52 locations, 0, 1, 2, 0, 1, 2, etc.

Composite data words are retrieved from FIFO 52, and processed by data execution unit 42. The particular composite data word retrieved from FIFO 52 is designated by the contents of a FIFO pointer circuit 516, provided in address generator 32 which likewise varies the location from which the data is retrieved in simulation of a FIFO stack operation. Referring to FIG. 5B, FIFO pointer circuit 516 suitably also comprises a modulo 3 (0–2) up-counter 517. During normal steady state operation of filter 10, FIFO pointer 516 designates the particular location of FIFO 52 instantaneously corresponding to the "middle" data value for retrieval. That is, FIFO pointer circuit 516 typically designates the location containing neither the most recent nor the oldest data point; rather, the location containing middle data point is designated. In this way, both a newer and an older data point remain available in FIFO 52 in the event it is desirable to compensate for creep present in word clock LRCI, as discussed in greater detail below and in conjunction with FIGS. 5A and 5B.

As successive input data words are sequentially written into locations 0–2 of input FIFO 52 in a continuous loop fashion, the data words resident in FIFO 52 are sequentially retrieved for processing by data execution unit 42 on a temporally first in, first out (FIFO) basis. During normal operation, once a data word has been retrieved from FIFO 52, it nonetheless remains in its position in FIFO 52, and is simply written over as a subsequent input data word is written into the same location of FIFO 52. In this way, three sequential data words are generally maintained in FIFO 52 during normal steady state operation.

The retrieval of data from FIFO 52 and the subsequent processing thereof by data execution unit 42 is controlled by timing generator 40 (FIG. 2) of control system 20, thereby effectively isolating the filter 10 from the external clocks (e.g., bit clock BCKI and word clock LRCI) of CD player 14, permitting free running operation of filter 10. Input FIFO 52 thus functions, inter alia, as a data input buffer, and is employed to compensate for creep exhibited by the word clock (LRCI). More particularly, referring to FIGS. 2A, 2B, 5A and 5B, timing generator 40 (FIG. 2A) comprises control circuit 41 and system clock 43. System clock 43 is correlated to the data retrieval bit clock BCKI (see FIG. 4) resident in CD player 14; system clock 43 generates a series of clock pulses at a frequency (e.g., 256 Fs or 384 Fs) which is suitably exactly equal to a predetermined integer multiple (e.g., 8) of the frequency of bit clock BCKI established by mode control interface 28.

In order to coordinate the retrieval of input data words from ROM 12 with the processing of data within computation subsystem 22, it is important that the period of operation of word clock LRCI (resident in CD player 14) be substantially equal to and coincident with the sample (processing cycle) period P of DSP 103. In other words, DSP 103 must be prepared to accept and retrieve new data words during the time period that they are present in latches 72 and 74. Recall, however, that input data interface 24 operates asynchronously with respect to computation system 22. Although system cycle and word clock LRCI are intended to be coincident, many factors can influence the extent to which an electronic clocks exhibit "true" periodicity, e.g., temperature, humidity, and material degradation.

Ideally, the beginning of each sample period P coincides with a transition, e.g., the rising edge, of word clock LRCI. If the beginning of a sample period P deviates from the rising edge of word clock LRCI by more than one sample period P, the integrity of the data processing algorithm (which implements the filter, noise shaper, and PWM functions as discussed below) is corrupted. For example, when the beginning of a new sample period falls behind the rising edge of word clock LRCI by an entire data retrieval (LRCI) period, a new input data word would typically be written into FIFO 52 before computation subsystem 22 can retrieve the input data word corresponding to the current sample period. This results in the input data word corresponding to the current sample period being written over in FIFO 52 before it is retrieved and processed. If, on the other hand, the beginning of a sample period drifts ahead of the rising edge of word clock LRCI, computation subsystem 22 will attempt to retrieve the "next" input data word before it is completely acquired and written into FIFO 52; consequently, the same input data word will be retrieved twice during successive cycles of operation of filter 10. Thus, it is desirable to monitor the relative periodicity of sample period P and word clock LRCI and to compensate, as necessary, for deviations therebetween. Correction circuit 41 is designed to compensate for these phenomena without the need to resynchronize the beginning of a sample period to the rising edge of word clock LRCI and, thus, without disrupting the flow of output data from digital filter 10.

Figure 5A:
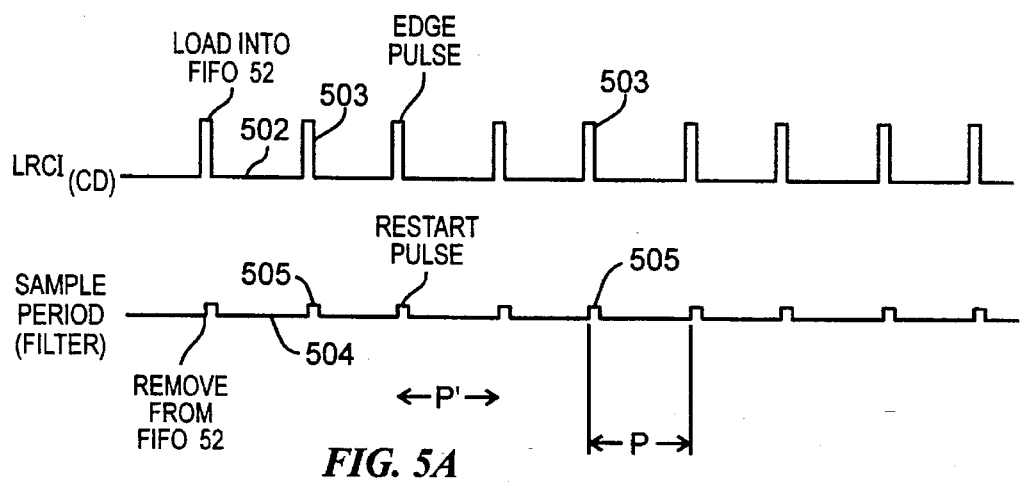
FIG. 5A is a diagram showing the temporal relationship between the data retrieval clock and the DAC system clock.
Figure 5B:
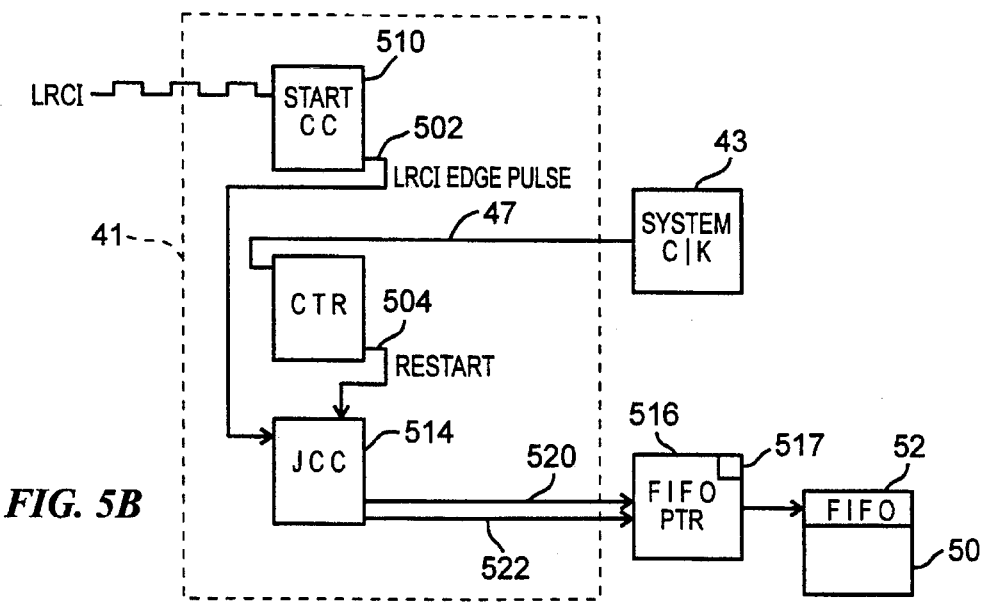
FIG. 5B is a block diagram of the litter reduction portion of the timing generator block of FIG. 2A.

Referring now to FIGS. 5A–5B, correction circuit 41 suitably comprises a start circuit 510, an up-counter 512, and a jitter correction circuit ("JCC") 514. Start circuit 510 is suitably an edge detector configured to monitor the Output of word clock LRCI and to generate an output signal 502 including respective edge pulses 503 corresponding to the detection by start circuit 510 of a rising edge of word clock LRCI.

Up-counter 512 cooperates with system clock 43 to generate a restart pulse train 504. More particularly, system clock 43 outputs a pulse train 47 nominally at a frequency suitably equal to an integral multiple of the frequency of bit clock BCKI. Pulse train 47 is applied to up-counter 512. Up-counter 512 is also configured to cooperate with mode control interface 28 to generate a restart pulse train 504 in accordance with user-selected parameters. For example, if filter 10 is to be operated as a 4× interpolation filter operating at, e.g., 256 system clock pulses per cycle, up-counter 512 is configured as a modulo 256 counter. In the illustrated embodiment, wherein filter 10 functions as an 8× interpolation filter operating at a sample period P equal to 384 system clock pulses, up-counter 512 is suitably configured as a modulo 384 counter.

Up-counter 512 generates a restart pulse train 504 in accordance with pulse train 47 and mode control interface 28. As seen in FIG. 5A, restart pulse train 504 comprises successive start pulses 505 separated by sample period P. Ideally, restart pulses 505 will be coincident with the first edge pulse 503 generated in response to the first rising edge of word clock LRCI detected by start circuit 510. However, pulses 503 and 505 may be offset by one or more system clock pulses due to, e.g., propagation delays inherent in digital implementation, as discussed in greater detail below.

Output signal 502 and restart pulse train 504 are applied to JCC 514. JCC 514 monitors the relative periodicity of signals 502 and 504; hence, JCC 514 indirectly monitors the point in time at which input data is written into FIFO 52 (controlled by word clock LRCI) relative to the point in time at which data is retrieved from FIFO 52 (controlled by timing generator 40). As discussed in greater detail below, if the sample period P lags sufficiently behind the period P' exhibited by word clock LRCI, JCC 514 generates a first correction signal 520; if the word clock period P' lags sufficiently behind sample period P, JCC generates a second correction signal 522.

As stated above, the period between successive edge pulses 503 (indicative of acquisition of a data word) and the period between successive start pulses 505 (indicative of the DSP cycle) is desirably exactly equal. Inasmuch as this is not always the case, correction circuit 41 is configured to cause FIFO pointer circuit 516 to either reuse (in response to second correction signal 522) or discard (in response to first correction signal 520) an input data word from FIFO 52 as necessary to compensate for excessive jitter between word clock LRCI and restart pulse train 504.

With particular reference to FIG. 5B, upon initial powering up of DSP 103, restart pulse train 504 is initially substantially synchronized with word clock LRCI. More particularly, start circuit 510 enables up-counter 512 (connection not shown) upon the initial detection by start circuit 510 of the first rising edge of word clock LRCI. Thus, the count of system clock pulses, which results in the first restart pulse 505 generated by up-counter 512, is initiated within a system clock pulse of pulse 503; pulse edge pulse 505 occurs within a few system clock pulses of, and ideally coincides with, the rising edge of word clock LRCI. Thereafter, up-counter 512 generates restart pulses 505 in accordance with, inter alia, its internal up-counting mechanism and system clock 43; up-counter 512 need not be thereafter resynchronized to word clock LRCI until DSP 103 is again powered up.

With continued reference to FIGS. 5A–5B, edge pulse train 502 and restart pulse train 504 are initially substantially synchronized upon initial powering up of filter 10. Thereafter, during steady state, "within limits" operation, JCC 514 detects alternately edge pulses 503 from start circuit 510 and restart pulses 505 from up-counter 512. If JCC 514 first detects an edge pulse 503, correction circuit 41 waits for the detection by JCC 514 of a restart pulse 504. If, on the other hand, JCC 514 first detects a restart pulse 505, JCC 514 waits for the detection of an edge pulse 503. The foregoing is true upon initial power up or at any other time during steady state operation.

More particularly, upon the detection of an edge pulse 503, if JCC 514 next detects a restart pulse 505 before detecting the next edge pulse 503, no correction signal is generated. As long as JCC 514 alternately detects an edge pulse 503 and a restart pulse 505, indicating that the difference between the period exhibited by edge pulse train 502 and restart pulse train 504 is less than one sample period P, correction circuit 41 continues to effect steady state operation.

If JCC 514 detects two successive edge pulses 503, i.e., if two successive edge pulses 503 occur without an intervening restart pulse 505, JCC 514 generates a correction signal 520; the detection of two successive edge pulses 503 without an intervening restart pulse 505 indicates that the DSP system sampling period P is greater than the data word acquisition period P' (word clock LRCI). As a result, computation subsystem 22, which executes an operational cycle in accordance with sample period P (restart pulse train 504), will tend to lag behind data acquisition from the ROM 12. In response to a correction signal 520, FIFO pointer circuit 516 increments its internal up-counter, causing pointer 516 to skip the next input data point from FIFO 52, as described in greater detail below.

Having generated a correction signal 520, correction circuit 41 waits until JCC 514 detects a restart pulse 505. Upon the detection of restart pulse 505, the system returns to steady state operation.

If JCC 514 detects two successive restart pulses 505 without detecting an intervening edge pulse 503, JCC 514 generates a correction signal 522. The detection of two consecutive restart pulses 505 indicates that the system sampling period P is less than the data acquisition period P' (word clock LRCI). This could result in a situation where FIFO pointer 516 would retrieve from FIFO 52 the data point most recently written into FIFO 52, as opposed to retrieving the "middle" data point (which is neither the oldest nor the newest data point), as is desired. In response to correction signal 522, pointer circuit 516 decrements its internal up-counter, causing pointer 516 to again retrieve the same data point from the same location in FIFO 52 which was retrieved in the previous cycle.

During normal steady state operation, i.e., when JCC 514 alternately detects edge pulses 503 and restart pulses 505, FIFO pointer circuit 516 addresses the "middle" data point from location 0, 1, or 2 of FIFO 52 for retrieval in accordance with the up-counter 517 resident in FIFO pointer circuit 516. More particularly, input data is written into the respective locations 0–2 of FIFO 52 in up-counter fashion in accordance with the contents of counter 71. For example, in three consecutive cycles: if in the first cycle new data is written into location 1 of FIFO 52, FIFO pointer circuit 516 retrieves the data from location 0 of FIFO 52, and the oldest data resides in location 2; during the next operational cycle, a new input data point is written into location 2 of FIFO 52 while FIFO pointer circuit 516 reads the data from location 1 of FIFO 52 (the oldest data is in location 0); during the next operational cycle, a new data point is written into location 0 of FIFO 52 while FIFO pointer circuit 516 reads the data from location 2, and so on.

Thus, FIFO pointer circuit 516 increments by one each time it reads a data value from FIFO 52 during normal operation. However, when JCC 514 determines that a correction is necessary, FIFO pointer circuit 516 deviates from its normal mode of operation in response to either first correction signal 520 or second correction signal 522.

More particularly, JCC 514 generates correction signal 520 when the system sampling period P has become significantly greater than the period P' during which data is input to FIFO 52. Accordingly, upon incrementing the up-counter resident within pointer circuit 516 (in accordance with normal operation), pointer circuit 516 increments its up-counter a second time during a single sample period in response to first correction signal 520. As a result, an input data value resident in FIFO 52 is not used. However, the omission of the data point is not perceptible by a listener, and the cumulative offset between the data retrieval and system processing periods is substantially eliminated.

Conversely, if JCC 514 determines that the processing sampling period P is significantly less than the data retrieval period, JCC 514 generates second correction signal 522 which effectively inhibits pointer circuit 516 from advancing. More particularly, correction signal 522 causes pointer circuit 516 to decrement its up-counter during the same operational cycle in which it immediately previously incremented the up-counter. While the same data point is read from FIFO 52 twice, it is not perceptible to the listener, and, again, pointer 516 is adjusted to reflect the actual state of data retrieval, i.e., is compensated for cumulative offset.

After JCC has generated a correction signal 520 or 522, data retrieval pointer 516 once again lags data storage pointer 71 by a single count, wherein the "middle" data point in FIFO 52 is used.

Steady State Filter Operation

In accordance with one aspect of the present invention, the interpolation operations performed by computation subsystem 22 employ multiplierless filter technology, wherein conventional multipliers utilized in prior art systems are replaced with binary adders and shift registers, and further wherein a "shift-and-add" scheme is employed in lieu of conventional multiplication techniques.

Multiplierless filtering is effected by employing coefficients (weighting by which the input data points are multiplied), each coefficient suitably comprising a sum of terms, each term being of the form $2^P$. This results from the fact that a binary multiplication by a "power-of-two" coefficient is equivalent to a shift of the multiplicand; fixed point multiplication may thus be effected through a series of simple shifting and adding operations.

The general expression for a finite impulse response ("FIR") filter is given as $$I = c_0 x_n + c_1 x_{n-1} + c_2 x_{n-2} \ldots + c_M x_{n-M} \quad (1)$$

where "I" represents the calculated value which, in a preferred embodiment, constitutes an interpolated value, each "x" value represents a data word, and each "c" represents the coefficient by which a data word "x" is weighted (multiplied).

Digital filters are characterized in terms of, inter alia, the number of taps comprising the filter (or a particular filter stage), wherein the number of taps corresponds to the number of data points multiplied by a corresponding coefficient. In general, a greater number of taps permits interpolation to a greater degree of accuracy.

Figure 15:
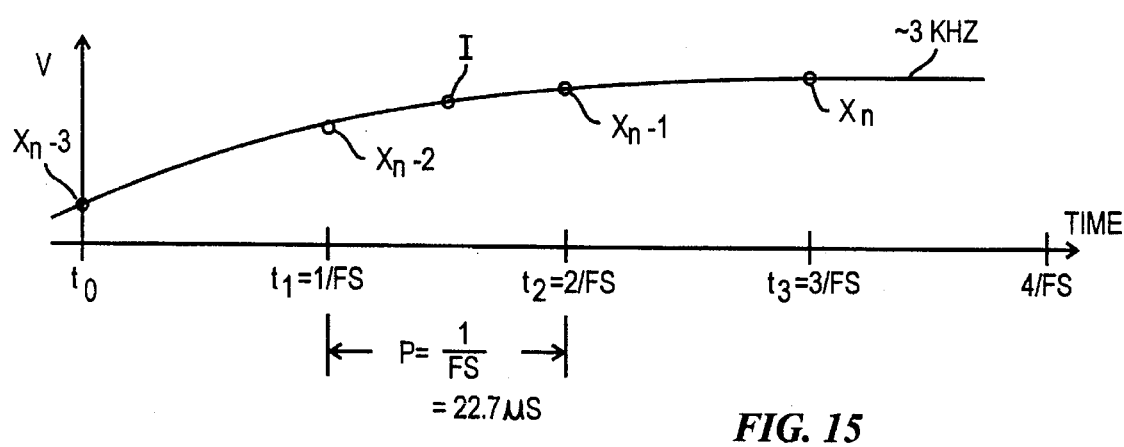
FIG. 15 is a diagram of a basic 2× interpolation showing the position of an interpolated point "1" between two existing data points.

Equation (1) may be understood in the context of an exemplary audio signal 302 shown in FIG. 15. As discussed above, a digital representation of the originally recorded analog audio signal is recorded on ROM 12 at a predetermined sampling frequency Fs, e.g. Fs=44.1 kHz. Thus, each binary input data word retrieved from ROM 12 represents a digital sampling of the original audio signal taken at 1/Fs= 22.68 microsecond intervals. Through the process of interpolation, additional data points are calculated and "filled in" between each sampled data point, by a process known in the art as oversampling. Properly implemented oversampling techniques can significantly enhance the audio quality of the reproduced signal.

With continued reference to FIG. 15, audio signal 302 represents a portion of a 3 kHz audio signal. Although typical audio signals, e.g. music, are substantially more complex than the audio signal shown in FIG. 15, a simplified 3 kHz signal is illustrated for clarity and to facilitate this discussion. Those skilled in the art will appreciate that this discussion may be extrapolated to wave forms of any complexity.

Audio signal 302 is sampled once per period P=1/Fs (e.g., P=22.7 microseconds) and recorded as a digital data word on ROM 12. As discussed above in connection with FIGS. 1–3, these digital values are retrieved from ROM 12 and loaded into FIFO 52 in sequence. The data from FIFO 52 are sequentially loaded into designated locations in stage one memory 60 of RAM 50, as will be explained. The data in memory 60 is accessed and utilized in the interpolation scheme described herein.

More particularly, assuming that signal 302 is sampled at an arbitrary time $t_0$; the voltage (amplitude) value of signal 302 at time $t_0$ is represented as digital data value $x_{n-3}$. Similarly, data value $x_{n-2}$ represents the amplitude of signal 302 one sample period later (i.e., at time $t_1$=1/Fs); data words $x_{n-1}$ and $x_n$ represent the amplitude of digital signal 302 at respective subsequent sampling intervals $t_2$=2/Fs and $t_3$=3/Fs, respectively.

In accordance with one aspect of the present invention, a predetermined number, e.g., seven, interpolated data points are calculated (filled in) between each pair of input data values. For example, a total of seven data points are interpolated between input data points $x_{n-1}$ and $x_n$; an additional seven interpolated data points are calculated between $x_{n-1}$ and $x_{n-2}$, and so on.

Each input data word x thus has seven interpolated values associated with it as it is output from digital filter 10; hence, filter 10 outputs eight times the number of data points which are input into filter 10. As discussed above, this 8× interpolation is advantageously performed as a sequential series of 2× interpolation stages: (2×)(2×)(2×)=8×.

The foregoing 8× interpolation process is preferably implemented through a polyphase process. More particularly, a two-phase process is employed, whereby an interpolated data value is calculated at a particular filter stage (e.g., stage 1, stage 2, or stage 3), and written together with the associated original data point into the memory sector corresponding to the next successive stage; the calculation of an interpolated data point in this manner corresponds to the first phase (phase one) and the "passing through" of the original data corresponds to the second phase (phase two) of the process.

For example, each time an interpolated data value is calculated during stage one-phase one operation, that interpolated data value is ultimately written into stage two memory (phase one operation). Thereafter, a raw (non-interpolated) data point is retrieved from stage one memory and written into stage two memory (phase two operation). Similarly, after an interpolated value is computed during stage two processing and ultimately written into stage three memory (phase one operation), an associated data point from stage two memory is written directly into (passed through to) stage three memory (phase two operation). Such two-phase operation is, likewise, implemented during stage three processing. Note that each filter stage yields an interpolated and a non-interpolated data point; this corresponds to the "2x" interpolation which is performed at each stage, as discussed above.

In an alternate preferred embodiment, a coefficient of less than unity is suitably used during phase two operation of one or more lower stages (e.g., stage one). For example, in circumstances where it may be possible to exceed the capacity of the adder or other elements used in the filtering process, it may be desirable to scale the value of the phase two coefficient from unity to on the order of, for example, 0.98. If a phase two coefficient of less than unity is employed, the phase two data value which would otherwise be "passed through" to the next succeeding filter stage is suitably first applied to execution circuit 42 to be multiplied by its associated phase two coefficient, and thereafter applied to the next succeeding memory stage, in a manner analogous to that below in connection with phase one data values.

An exemplary interpolation, e.g. a first stage 2x interpolation, suitably proceeds as follows.

Referring to FIG. 15, an exemplary interpolated data point I may be determined in accordance with Equation (1). Specifically, data point $x_n$ is multiplied by a predetermined coefficient $c_0$; data point $x_{n-1}$ is multiplied by a predetermined coefficient $c_1$; data point $x_{n-2}$ is multiplied by a predetermined coefficient $c_2$; and data point $x_{n-3}$ is multiplied by a predetermined coefficient $c_3$. The foregoing products are then added together to yield the interpolated value I. Although the foregoing example involves the multiplication of four data points by four coefficient (taps), those skilled in the art will appreciate that this scheme can be extrapolated to include any desired number of data points and corresponding coefficients.

Upon determining an interpolated value I for each input data point x, a second stage 2x interpolation is performed, resulting in a total of four times the number of original input data points. Thereafter, the 4x interpolated data is used as input for the third stage 2x interpolation, resulting in a total of 8x interpolated values for each input data point x.

Referring now to FIGS. 3 and 8–11, a preferred exemplary embodiment of three-stage interpolation will now be described.

As previously discussed, the input data values for the first stage filter reside in stage one memory 60 of RAM 50 (FIG. 3). (The manner in which the data are retrieved from input FIFO 52 and written into stage one memory 60 is described below.) The input data values for the second stage filter reside in stage two memory 66 of RAM 50, and the input data values for the third stage filter reside in stage three memory 64 of RAM 50.

Figure 9:
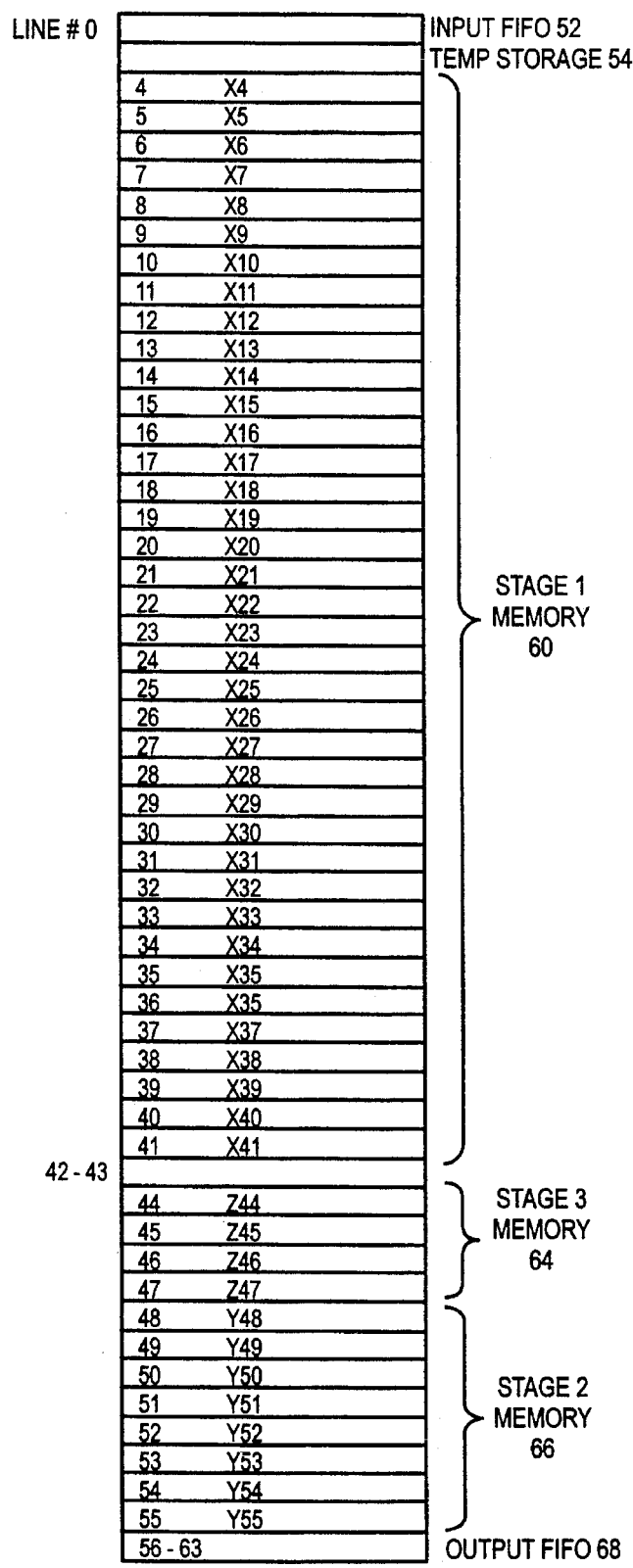
FIG. 9 is a memory map setting forth the allocation of storage registers in the data storage unit of FIG. 2A.

More particularly and with specific reference to FIG. 9, stage one memory 60 suitably comprises a predetermined number of locations corresponding to the number of non-zero coefficients employed in the first stage filter, e.g. thirty-eight memory locations, namely, locations 4–41 of RAM 50, containing indicia of the original data words retrieved from CD ROM 12. Certain prefiltering processing, e.g., scaling, may be performed on these data prior to being written into stage one memory 60 if desired.

First stage filtering (interpolation) is performed using the thirty-eight data points from stage one memory 60. In the context of Equation (1), each data value in stage one memory, namely, data values $x_4$–$x_{41}$, is effectively multiplied by a predetermined coefficient stored in coefficient ROM 51 (FIG. 2). The respective products of each data value and its corresponding coefficient are effectively summed to arrive at a single interpolated value. Each time an interpolated value is determined from applying Equation (1) to stage one memory during stage one-phase one processing, the resulting interpolated data point is written (although not necessarily directly, as discussed below) into stage two memory (phase one operation). In addition, the original input data word is also written from stage one memory into stage two memory (phase two operation). The manner in which the particular location in stage two memory into which each stage one output is written is discussed below in conjunction with FIG. 7.

A second stage 2x interpolation is performed using a data value from each location of stage two memory 66 (i.e., locations 48–55) in like manner. The data values resulting from stage two interpolation (phase one), as well as a data value from stage two memory (phase two), are ultimately written into stage three memory 64, at lines 44–47. A third stage 2x interpolation is performed in like manner using the stage three memory data as inputs.

Figure 11:
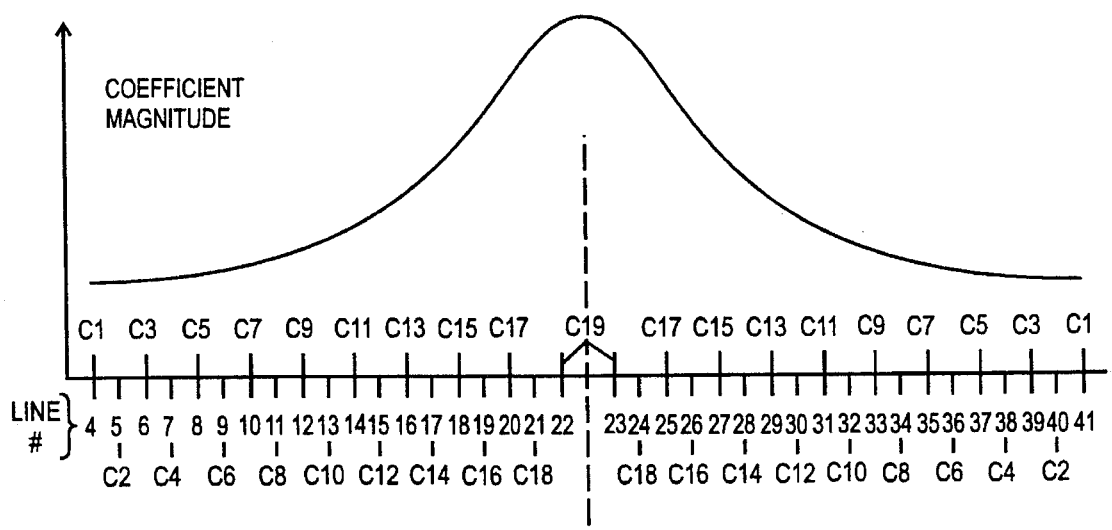
FIG. 11 is a graphical representation of the symmetric nature of the interpolation filter coefficients of an exemplary stage one filter in accordance with the present invention.

With particular reference to FIG. 11, the use of half band symmetrical filters results in a zero value for approximately half of the coefficients and data values. In the illustrated embodiment, the first stage filter comprises a total of seventy-five taps. Of these, thirty-six taps have a zero value and one has a value of unity, leaving thirty-eight data points to be "multiplied" by a non-zero coefficient during stage one-phase one operation. Stage one-phase two operation involves "multiplying" an original data point by unity; i.e., the original data point is simply passed on to stage two memory, inasmuch as all other phase two coefficients (and, indeed, the phase two data values as well) are equal to zero. As shown in FIG. 11, the symmetrical distribution of the non-zero coefficient values C1–C19 results in significant computational efficiencies. As a particular example, it can be seen that the data value from location 4 and the data value from location 41 (see FIGS. 9 and 11) are multiplied by the same coefficient C1; the data values from location 5 and location 40 are also multiplied by the same coefficient C2, and so on. Thus, for the thirty-eight data points comprising stage one memory, a total of nineteen unique non-zero coefficients are required:

TABLE 1

| Coefficient number | Decimal Value |
| --- | --- |
| C1 | 0.001220703 |
| C2 | −0.001464843 |
| C3 | 0.002197265 |
| C4 | −0.003173828 |
| C5 | 0.004394531 |
| C6 | −0.005981445 |
| C7 | 0.00805664 |
| C8 | 0.010742187 |

TABLE 1-continued

| Coefficient number | Decimal Value |
| --- | --- |
| C9 | 0.01361875 |
| C10 | −0.017700195 |
| C11 | 0.022460937 |
| C12 | −0.028564453 |
| C13 | 0.036376593 |
| C14 | −0.046630859 |
| C15 | 0.061035156 |
| C16 | −0.082519531 |
| C17 | 0.120605468 |
| C18 | −0.206054687 |
| C19 | 0.626220703 |

With continued reference to FIG. 9, the second stage filter suitably corresponds to a fifteen tap filter; of the fifteen taps, six have coefficient and data values equal to zero and one coefficient equal to unity, leaving eight data points to be multiplied by a coefficient having a non-zero value during stage two-phase one operation. Of the eight non-zero coefficients, a total of four unique coefficient values are necessary due to the symmetric nature of the filter:

TABLE 2

| Coefficient number | Decimal Value |
| --- | --- |
| C1 | −0.009277343 |
| C2 | 0.045898437 |
| C3 | −0.149414062 |
| C4 | 0.61326125 |

Similarly, the stage three filter comprises seven taps, of which two coefficient and data values are zero and one coefficient value is equal to unity. Of the remaining four non-zero taps, a total of two unique non-zero coefficients are suitably employed during stage three-phase one operation. Exemplary stage three coefficients are set out in Table 3.

TABLE 3

| Coefficient number | Decimal Value |
| --- | --- |
| C1 | −0.070800781 |
| C2 | 0.05703125 |

Thus, the 8× interpolation performed by the foregoing cascaded, three-stage 2× configuration comprises a total of ninety-seven taps (stage one equals seventy-five taps, stage two equals fifteen taps, stage three equals seven taps). However, the ninety-seven tap, three-stage interpolation is performed using a total of twenty-five unique non-zero coefficients (stage one entails nineteen coefficients, stage two entails four coefficients, stage three entails two coefficients), resulting in significant computational efficiencies over filters which do not employ half band, symmetrical implementation.

Figure 10:
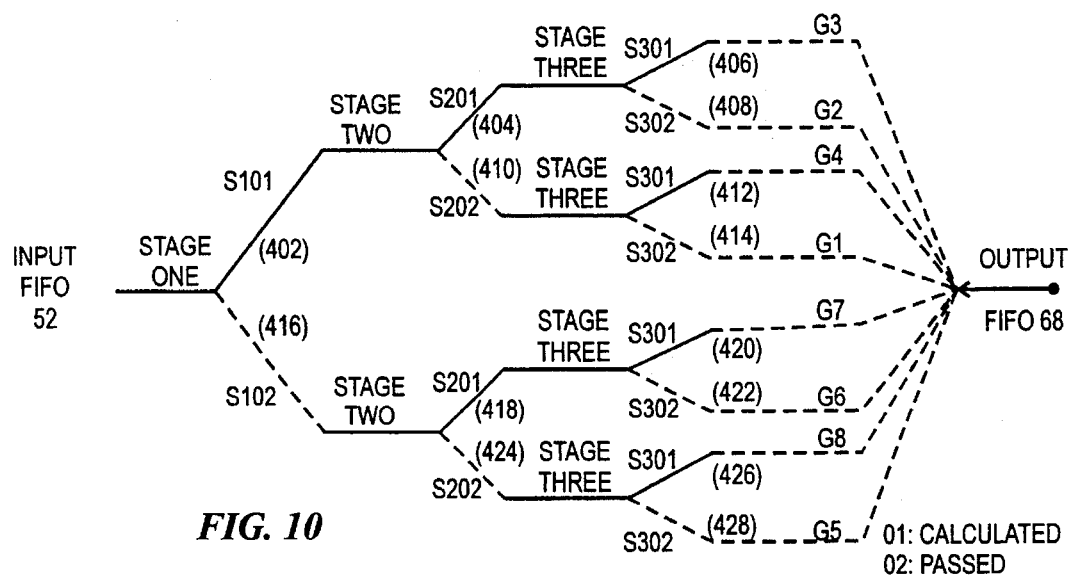
FIG. 10 is a schematic diagram of computations used in the polyphase implementation of the three stage interpolation filter indicated in FIG. 1.
Figure 12:
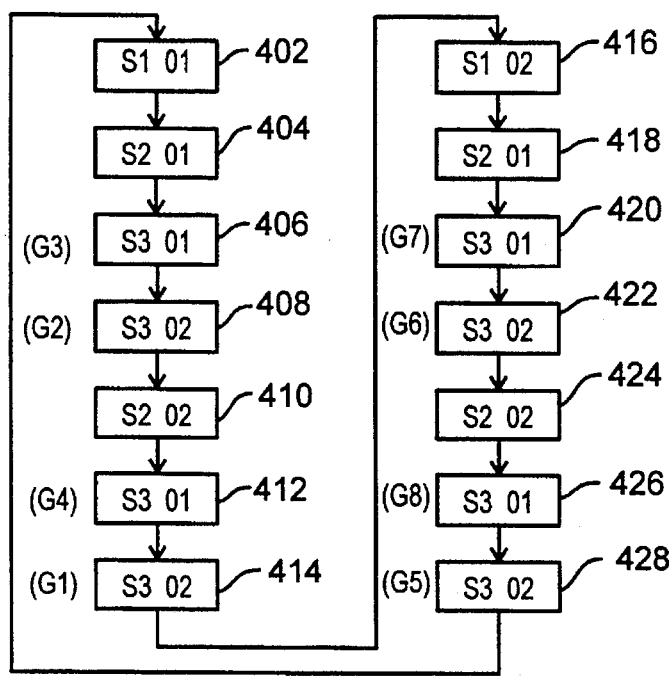
FIG. 12 is a block diagram showing the order of polyphase computation of the various stages of an exemplary filter.

Referring now to FIGS. 10 and 12, the data flow scheme used to implement the foregoing cascaded three-stage 2× interpolation will now be described.

Each filter stage performs a 2× interpolation. For each data point input to a particular stage, a total of two data points are output by that stage: one corresponding to an interpolated (phase one) value and one corresponding to a passed through (phase two) value of the input data point. It is upon this principle that polyphase implementation is predicated. In particular, all stage one outputs (phase one and phase two) are ultimately written into stage two memory. As schematically illustrated in FIG. 10, for each stage one output (whether it be a "phase one" or a "phase two" output), stage two produces two outputs: a stage two-phase one output and a stage two-phase two output. All stage two outputs (phase one and phase two) are ultimately written into stage three memory. For each stage two output (whether it be a "phase one" or a "phase two" output), stage three produces two outputs: a stage three-phase one output and a stage three-phase two output. All stage three outputs (phase one and phase two) are written to output FIFO 68 and subsequently output from filter 10.

More particularly, the stage one-phase one output for a particular data point preferably corresponds to a seventy-five tap shift-and-add operation (described in greater detail in conjunction with FIG. 6) on the thirty-eight data points resident in stage one memory in accordance with Equation (1) (Step 402). Thus, stage one-phase one processing produces a single output value which is ultimately written into stage two memory for subsequent use as an input to the second stage filter. The stage one-phase two value corresponds to the particular original data value used in calculating the stage one-phase one output, and is similarly written into stage two memory for subsequent use as an input to the stage two filter (Step 416).

In similar fashion, the stage two-phase one output value corresponds to the interpolated value of the fifteen tap interpolation utilizing the eight data points instantaneously resident in stage two memory in accordance with Equation (1) (Steps 404, 418). In stage two-phase two operation, the data point used in computing the stage two-phase one value is simply passed on into stage three memory without computation (Steps 410, 424).

Stage three-phase one involves the application of Equation (1) to the four data points instantaneously contained in stage three memory 64 (i.e., locations 44–47) and writing the output value into output FIFO 68, i.e., locations 56–63 of RAM 50 (Steps 406, 412, 422, 428). The stage three-phase two output corresponds to a stage three memory value used in computing the stage three-phase one output value (Steps 408, 414, 422, 428), and loading the output into output FIFO 68 (Steps 408, 414, 422, 428).

Figure 8:
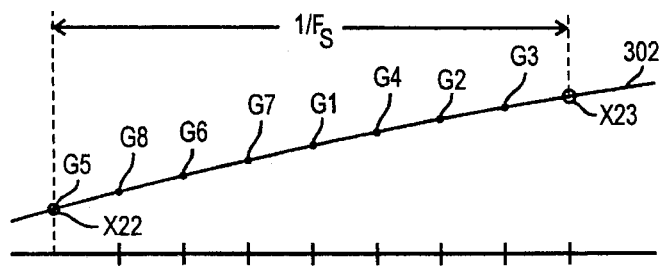
FIG. 8 is a graphical representation of an analog signal showing the order of computation of various interpolated points.

Referring now to FIGS. 8, 10, and 12, the foregoing polyphase scheme comprises a total of fourteen steps. In order to ensure that the data points which are output from output FIFO 68 remain in the proper sequence, the fourteen steps are advantageously performed in the following order:

| STAGE/PHASE | |
| --- | --- |
| Stage 1, Phase 1 (on the then current Stage 1 memory data, including an original data point (e.g., X22) to calculate and store G1) | (Step 402) |
| Stage 2, Phase 1 (on the then current Stage 2 data, including the resultant interpolation value (e.g., G1) of Step 402 to calculate and store G2) | (Step 404) |
| Stage 3, Phase 1 (on the then current Stage 3 data, including the resultant interpolation value (e.g., G2) of Step 404 to calculate and output G3) | (Step 406) |
| Stage 3, Phase 2 (pass through Stage 3 memory data point to output G2) | (Step 408) |
| Stage 2, Phase 2 (pass through Stage 2 memory data point G1 to State 3 memory) | (Step 410) |
| Stage 3, Phase 1 (on the then current Stage 3 data, including the resultant pass through | (Step 412) |

-continued

| STAGE/PHASE | |
|---|---|
| value G1 of Step 410 to calculate and output G4) | |
| Stage 3, Phase 2 (pass through Stage 3 memory data point G1 to output) | (Step 414) |
| Stage 1, Phase 2 (pass through Stage 1 memory data point G5 and store) | (Step 416) |
| Stage 2, Phase 1 (on the then current Stage 2 data, including the resultant pass through value G5 of Step 416 to calculate and store G6) | (Step 418) |
| Stage 3, Phase 1 (on the then current Stage 3 data, including the resultant pass through value G6 of Step 418 to calculate and output G7) | (Step 420) |
| Stage 3, Phase 2 (pass through Stage 3 memory data point G6 to output) | (Step 422) |
| Stage 2, Phase 2 (pass through Stage 2 memory data point G5 and store) | (Step 424) |
| Stage 3, Phase 1 (on the then current Stage 3 data, including the resultant pass through value (e.g., G5) of Step 424 to calculate and output G8) | (Step 426) |
| Stage 3, Phase 2 (pass through Stage 3 memory data point G5 to output) | (Step 428) |

More specifically, Equation (1) is used to perform stage one-phase one calculations for an exemplary input data point X22 using all of the then current data in stage one memory 60, including, inter alia, an immediately preceding input data point X23, resulting in the calculation of interpolated data point G1 which is then written to stage two memory 66 (FIG. 8) (Step 402). More particularly, although each stage one output (phases one and two) is written to stage two memory, and each stage two output (phases one and two) is written to stage three memory, in the context of a particularly preferred embodiment it is desirable that each data point which is output from either stage one or stage two be placed in temporary storage 54 prior to it being read into the next successive stage. The manner in which the various interpolated and "passed through" data points are routed through temporary storage en route to the next successive stage of memory is discussed in greater detail below in conjunction with FIGS. 7 and 8.

A stage two-phase one calculation (again using Equation (1)) is then performed using all of the then current data in stage two memory 66, including, inter alia, respective points G1 (written to stage two memory during the current cycle) and X23 (written to stage two memory in a previous cycle), to calculate interpolated data point G2 (Step 404). A stage three-phase one calculation is then performed using all of the then current data in stage three memory 64, including, inter alia, data point G2 (written to stage three memory during the current cycle) and data point X23 (written to stage three memory in a previous cycle), resulting in interpolated value G3 (Step 406). Data point G3 is then written into output FIFO 68.

A stage three-phase two operation is then performed on data point G2 (Step 408), passing data point G2 to output FIFO 68. Thereafter, a stage two-phase two operation (Step 410) passes data point G1 into stage three memory (via temporary storage 54). Data point G1 is then used in a stage three-phase one calculation (Step 412), to calculate data point G4 which is written into output FIFO 68. A stage three-phase two operation (Step 414) then writes data point G1 to output FIFO 68.

A stage one-phase two operation then passes original data point G5 (X22) to stage two memory (Step 416). A stage two-phase one operation (Step 418) calculates data point G6, and writes this data point to stage three memory (preferably via temporary storage 54). A stage three-phase one operation (Step 420) calculates data point G7 and writes it to output FIFO 68. A stage three-phase two operation (Step 422) then passes data point G6 to output FIFO 68.

A stage two-phase two operation (Step 424) passes data point G5 to stage three memory (Step 424). A stage three-phase one operation (Step 426) then calculates data point G8 and passes it to output FIFO 68. Finally, a stage three-phase two operation (Step 428) passes data point G5 to output FIFO 68.

By performing the foregoing operations in the order set forth in FIG. 12, the interpolated data points shown in FIG. 8 are calculated (or, in the case of point G5 (X22), simply accessed) in the following order: G1, G2, G3, G4, G5, G6, G7, G8. However, to provide proper temporal sequence, the data points are output to output FIFO 68 in the following order: G3, G2, G4, G1, G7, G6, G8, G5. In this way, the cascaded, three-stage interpolation may be performed in an uninterrupted fashion while outputting the interpolated data points in the proper chronological sequence.

In accordance with one aspect of the present invention, particular efficiencies in cycle execution time are achieved by employing various methodologies of inputting data into and retrieving data from memory 50. With reference to FIG. 9, the preferred flow of data through RAM 50 in the context of the foregoing 8× interpolation scheme will now be described.

Successive input data points are sequentially read from ROM 12 into FIFO 52 as described above in conjunction with FIGS. 1 and 2. During normal operation, the data are retrieved from FIFO 52 in up-counter fashion (i.e., from location 0, location 1, location 2, location 0, location 1, location 2 and so on) and successively written onto locations 4–41 of stage one memory. The "rolling" pointer scheme employed to retrieve the data from the appropriate location in FIFO 52 is discussed above in conjunction with FIG. 5; a similar "rolling" pointer scheme, employed to sequentially retrieve the data from FIFO 52 and write the data into memory locations 4–41 is discussed below in connection with FIG. 7. During stage one-phase one processing, coefficients C1–C19 (FIG. 11) are sequentially retrieved from coefficient ROM 51 (FIGS. 2 and 6), and Equation (1) is implemented using the 38 data points resident in stage one memory.

In accordance with one aspect of the present invention, pointer circuit 201 (FIG. 7A) is configured to control the retrieval of data from stage one, stage two, and stage three memory sectors, in an "inside-out" manner (described below), thereby minimizing the number and size of the circuit components required to implement the subject data retrieval functions.

Figure 6:
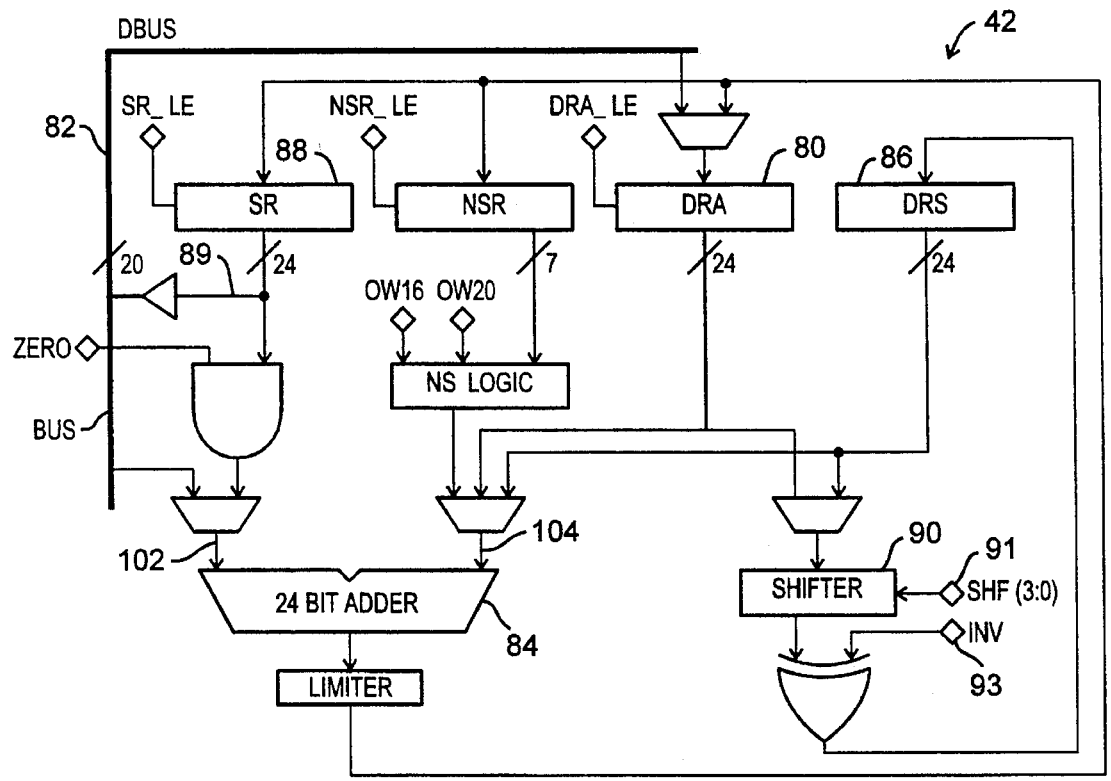
FIG. 6 is a schematic diagram of the data execution unit of the computation subsystem shown in FIG. 2A.
Figure 7A:
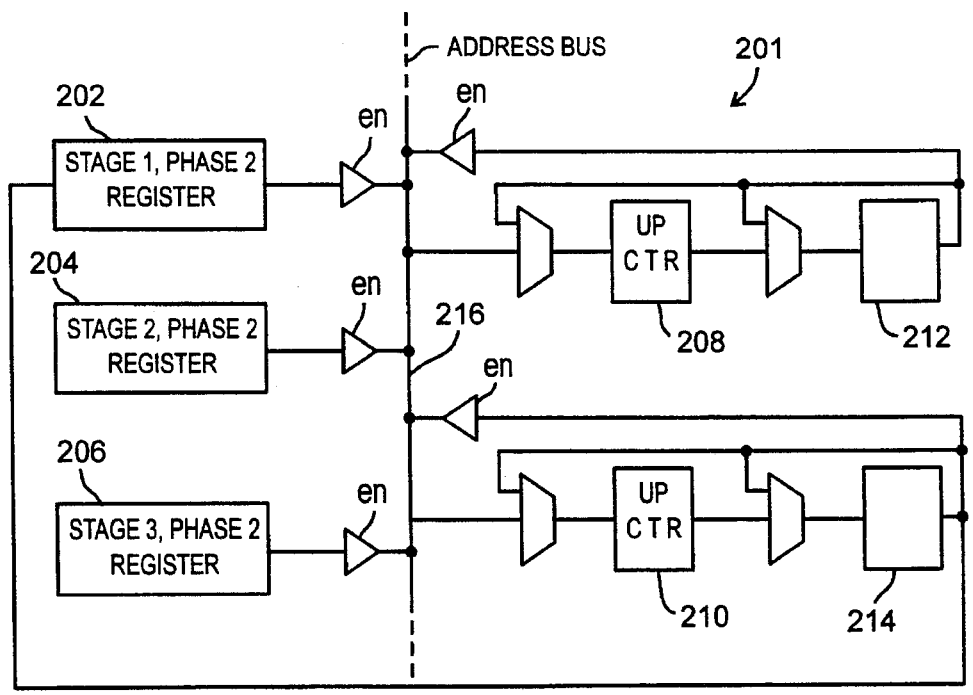
FIG. 7A is a block diagram of the pointer generator circuits of the control subsystem shown in FIG. 2A.
Figure 7B:
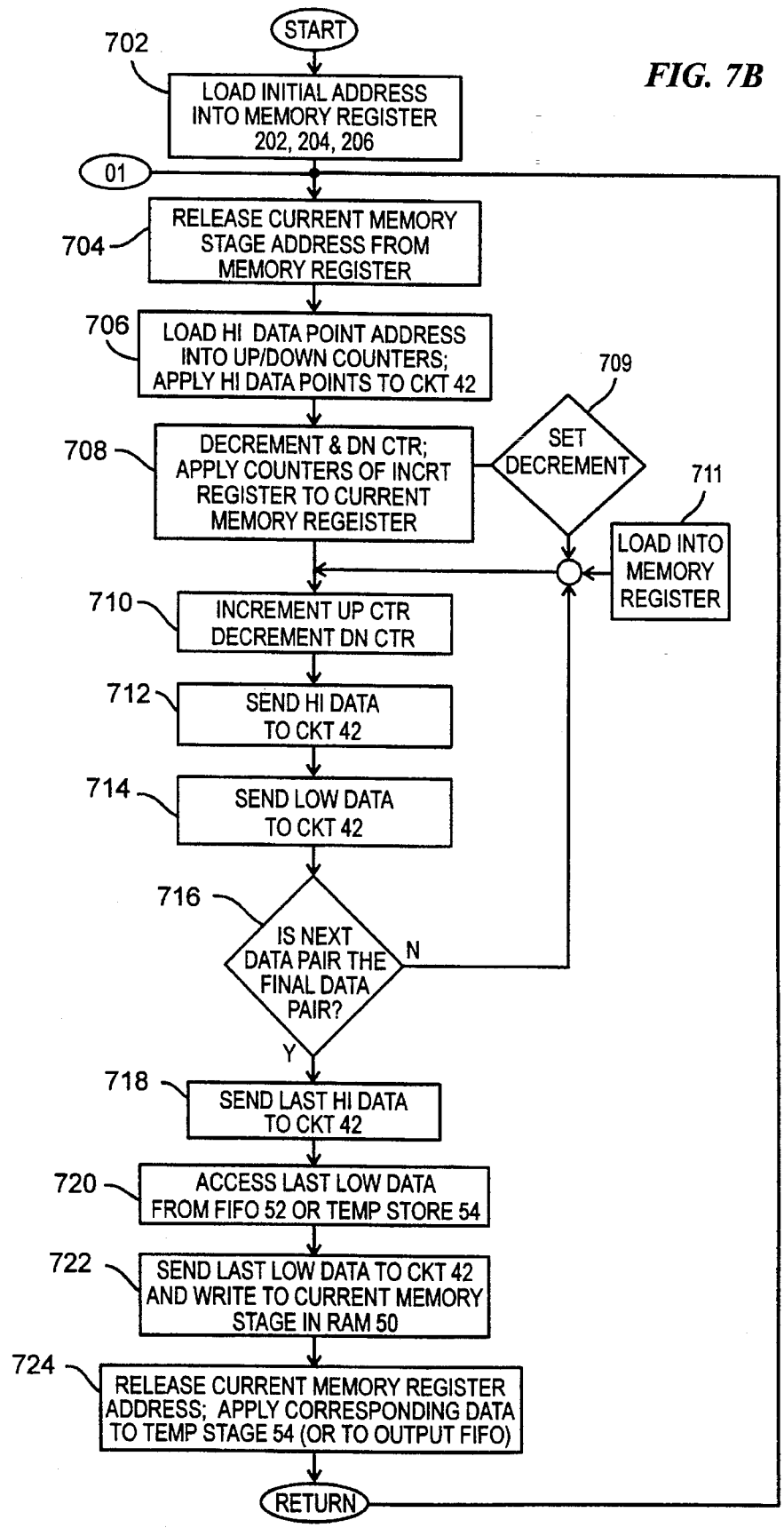
FIG. 7B is a flow chart of the function of the addressing scheme effected by the pointer circuit of FIG. 7A.

Referring now to FIGS. 7A–7B, pointer circuit 201 is suitably configured to cooperate with control sequencer (processor) 34 (FIG. 2) to effect the operational sequence described in conjunction with FIG. 12. More particularly, pointer circuit 201 is advantageously configured to sequentially retrieve respective symmetrical data pairs from the stage one, stage two, and stage three memory sectors to thereby facilitate the multiplication of the sum of each respective data pair by a predetermined coefficient c in accordance with data execution unit 42. The operation of data execution unit 42 is discussed in greater detail in conjunction with FIG. 6.

Pointer circuit 201, suitably resident in address generator 32 (FIG. 2), advantageously comprises a stage one register 202, a stage two register 204, a stage three register 206, an up-counter 208, a down-counter 210, an up-counter output register 212, a down-counter output register 214, and an address bus link 216.

The data retrieval scheme effected by pointer circuit 201 is referred to herein as an inside-out rolling pointer scheme. More particularly, during each computational cycle (sample period) of filter 10, each phase one operation involves multiplying each data point resident within the relevant stage memory (e.g., 60, 66, 64) by a corresponding coefficient to produce an interpolated value for the data set. As discussed above in conjunction with FIG. 11, the symmetrical nature of the filters used in the context of the present invention permits two data points to be multiplied by the same coefficient. Pointer circuit 201 is configured to select these data pairs, beginning with two adjacent data points, in a "rolling" manner. That is, two pointers are used to initially select two adjacent data points from memory. In the next computational cycle, one pointer is up-counted and the other is down-counted, to thereby select the next data pair. In each successive computational cycle, the two counters are incremented/decremented, to thereby sequentially select each data pair in an inside-out manner.

The subject data retrieval scheme is referred to herein as a "rolling" pointer scheme in that each computational cycle begins with the selection of two adjacent data points; moreover, the location in memory of the initial (adjacent) data pair shifts by one location during each successive computational cycle. The manner in which the "inside-out" and "rolling" features of the instant pointer scheme are implemented will now be described.

The process may begin at any arbitrary location corresponding to any two adjacent data points from stage one memory 60; consider, for example, an initial arbitrary data pair X22 and X23, corresponding to locations 22 and 23 of stage one memory 60 (FIG. 9).

Data points X22 and X23 are retrieved from stage one memory 60, added together, and thereafter effectively multiplied by a predetermined coefficient in data execution circuit 42, as discussed in greater detail below in conjunction with FIG. 6. Thereafter, data points X21 and X24 are retrieved from memory 50, and applied to data execution circuit 42, where they are summed, multiplied by a different coefficient, and the result accumulated with the previous result. This "inside-out" scheme is continued until all data pairs in first stage memory 60 have been accessed, and summed, multiplied, and accumulated in data execution circuit 42. In the next succeeding computational cycle, the process is repeated starting with a new data pair, e.g. data points X21 and X22 corresponding to locations 21 and 22, respectively, which data pair is offset from the adjacent data pair from the previous computational cycle by one location. In this way, once a data value is written into a memory location, it remains there until it is written over by a new input data point. Thus, it is not necessary to shift or otherwise cycle data within any of the memory sectors; rather, the rolling pointer scheme starts at a different line within a particular memory sector for each computational cycle, thereby effectively "cycling" the data points through memory without actually moving any of the data points within memory. This rolling, inside-out pointer scheme utilizes a minimum of circuitry, and thus greatly enhances the computational efficiency of filter 10. The manner in which the data are retrieved from each of stage one, stage two, and stage three memories of RAM 50 will now be described with reference to, inter alia, the general data flow scheme set forth in FIG. 7A.

With continued reference to FIGS. 7A–B and 9, upon initialization of system parameters, an address corresponding to a particular location within stage one memory 60 (e.g., location 23) is loaded into register 202 (step 702). Similarly, an address corresponding to a particular location within stage two memory 66 (e.g., location 52) is loaded into register 204, and an address corresponding to a particular location within stage three memory 64 (e.g., location 46) is loaded into register 206. (During steady state operation, the starting address within each register will already have been latched during the previous cycle.)

Under the control of sequencer 34 (FIG. 2A), the address within one of respective registers 202–206 corresponding to the filter stage which is then currently being processed is released onto address bus 216 (step 704). In the present example wherein the first data pair to be sent to execution circuit 42 (FIG. 6) corresponds to data points X22 and X23 (locations 22 and 23 from first stage memory 60), the address corresponding to location 23 is resident in register 202 and, thus, is released onto bus 216.

In addition to being released onto bus 216, the contents of register 202 (address 23) is also loaded into up-counter 208 and down-counter 210 (step 706). By releasing the address of location 23 onto bus 216, the data value from location 23 (data point X23) is thusly accessed and applied to execution circuit 42 in accordance with known processing techniques (step 706).

Down-counter 210 is then decremented in accordance with an instruction from sequencer 34 (step 708). Each time down-counter 210 is decremented, the decremented output value is stored in register 214 until released under the control of sequencer 34. (Similarly, each time up-counter 208 is incremented, the incremented value is stored in register 212 until it is released under the control of sequencer 34.)

The first time down-counter 210 is decremented during each phase one operational cycle, the output thereof is released from down-counter register 214 and loaded into the memory register for the particular stage being processed (i.e., into one of registers 202, 204, 206) (Steps 709, 711). In the present example, the address corresponding to location 22 (23 decremented by 1 equals 22) is loaded into register 202 and maintained therein through completion of stage one-phase one processing. As discussed in greater detail below, address 22 stored in register 202 is subsequently used in stage one-phase two to effectively "pass" the corresponding data point (X22) from stage one memory 60 to stage two memory 66.

The data value corresponding to the initially decremented address (loaded into register 202) is also applied to execution circuit 42 (step 708). In the present example, this initially decremented address value corresponds to data point X22, from location 22 of first stage memory 60. Consequently, the data pair comprising data points X22 and X23 are summed together and multiplied by a predetermined coefficient retrieved from ROM 51 in data execution circuit 42. The manner in which data execution circuit 42 sums, multiplies, and accumulates the various data points is hereinafter discussed more fully in connection with FIG. 6.

Up-counter 208 is incremented and down-counter 210 is again decremented (step 710), sequentially releasing the addresses corresponding to locations 24 and 21, respectively, onto bus 216 to thereby apply the data pair corresponding to data points X24 and X21 to execution circuit 42 (steps 712, 714). This process if repeated until all of the data points in the memory sector have been applied to execution circuit 42: Up-counter 208 and down-counter 210 are successively incremented/decremented to effect the application of data pairs (X25/X20), (X26/X19), (X27/X18) . . . (X40/X5) to execution circuit 42 in similar fashion (steps 710–716).

When the foregoing pointer scheme reaches the last data pair (step 716), corresponding to X41/X4 in the present example, data point X41 is retrieved and sent to execution circuit 42 (step 718); however, the corresponding symmetrical data point (e.g., X4) is not retrieved from memory, e.g. location 4. Rather, the corresponding data point is retrieved from the designated output location of FIFO 52 during stage one operation (step 720) (or from temporary storage 54 during stages two and three), and simultaneously written onto location 4 and applied to execution circuit 42 (step 722). In so doing, the data point previously resident in location 4 (which corresponds to the "oldest" data point in first stage memory 60) is written over by the newest data point from FIFO 52. Having retrieved and processed the nineteen symmetrical data pairs from first stage memory 60 in the foregoing manner, stage one-phase one operation is completed.

With continued reference to FIG. 7A, recall that in the instant example the address corresponding to location 22 is resident in register 202 at the end of phase one operation. Thus, when stage one-phase two operation is effected (see FIG. 12), the address within register 202 is released onto address bus link 216 to thereby pass the corresponding data point (X22), temporary storage 54, and thereafter to stage two memory 66.

In order to ensure that the interpolated data points are output in the correct sequence (see FIG. 8), a number of intervening steps 404–414 (discussed above in conjunction with FIG. 12) are performed after completion of the stage one-phase one (step 402) and effecting the stage one-phase two (step 416). Thus, while the address of the data point (e.g., X22) to be passed through is maintained in register 202, sequencer 34 effects stage two-phase one operation (FIG. 12, step 404) following the completion of stage one-phase one operation (step 402). More particularly, once a final interpolated value Y1 for a particular stage one-phase one operation in execution unit 42 is established, the interpolated value Y1 is written into temporary storage 54 (line 3 of RAM 50; FIG. 9). In this regard, temporary storage 54 functions as an input buffer for stage two memory 66 and stage three memory 64 in the same manner as input FIFO 52 functions as an input buffer for stage one memory 60.

More particularly, stage two-phase one operation (FIG. 12, step 404) is effected by releasing the contents of register 204 (FIG. 7) onto address bus 216 (FIG. 7; step 704), whereupon it is simultaneously loaded into up-counter 208 and down-counter 210 (step 706). At the same time, the data point from memory 66 corresponding to the address released from register 204 is applied to execution circuit 42 (step 706), and the process is repeated as discussed above in conjunction with stage one-phase one.

More particularly and with continued momentary reference to FIGS. 7A–B and 9, an exemplary address corresponding to, e.g., location 52 is initially released from register 204 onto bus 216 (step 704) and, hence, into up-counter 208 and down-counter 210 (step 706), thereby applying data point Y52 to execution circuit 42 (step 706). Thereafter, down-counter 210 is decremented (step 708), whereupon the decremented value is used to apply data point Y51 to execution circuit 42 (step 708), thereby effecting the summation of data pair (Y52/Y51). The first instance decremented value is also loaded into register 204 (steps 709, 711) and held there for later use in stage two-phase two operation (FIG. 12, steps 410 and 424).

Up-counter 208 and down-counter 210 are thereafter incremented/decremented (step 710), as discussed above in conjunction with stage one-phase one operation, to sequentially apply the data pairs (Y53/Y50) and (Y54/Y49) to execution circuit 42 (steps 712, 714). As with stage one-phase one operation, data point Y55 is thereafter applied to execution circuit 42 (step 718); however, the data point corresponding location 48 is not retrieved directly from location 48. Rather, the data point corresponding to location 48 (the "oldest" data value in stage two memory) is retrieved from temporary storage 54 (step 720), and simultaneously written onto location 48 and applied to execution circuit 42 (step 722). In this regard, recall that the interpolated data point which resulted from stage one-phase one operation, namely Y1, was written directly to temporary storage 52 upon completion of stage one-phase one operation. By reading the data point from temporary storage 52 and writing it to location 48 during stage two-phase one operation, the previous data value in location 48 corresponding to the then "oldest" data point is written over, in a manner analogous to the retrieval of a new data point from input FIFO 52 as discussed above in conjunction with stage one-phase one operation. Again, the foregoing algorithm minimizes the circuitry required to implement the subject data flow scheme.

Upon completion of stage two-phase one operation, the resulting interpolated value Y2 is written into temporary storage 54, whereupon it will be subsequently read during stage three-phase one operation and written into stage three memory 64 (step 724).

With continued reference FIG. 7A–B, 9 and 12, stage three-phase one operation proceeds in a manner analogous to stage one-phase one and stage two-phase one operation. More particularly, the contents of register 206 (corresponding to location 46) are released onto address bus 216 (step 704), whereupon address 46 is applied to up-counter 208 and down-counter 210 and data point Z46 (corresponding to location 46 of RAM 50) is applied to execution circuit 42 (step 706). Down-counter 210 is thereafter decremented (step 708), whereupon the decremented value is loaded into register 206 for subsequent use in stage three-phase two operation (steps 709, 711) and data point Z45 is applied to execution circuit 42 for summation with data point Z46 (step 708).

Up-counter 208 is decremented and down-counter 210 is decremented (step 710), and the contents of register 212 (e.g., corresponding to location 47) are released onto bus 216, thereby applying data point Z47 to execution circuit 42 (step 718); however, data value currently resident on location 44 is not applied to execution circuit 42. Rather, the data point corresponding to location 44 is retrieved from temporary storage 54 (step 720) and thereafter written onto location 44 and applied to execution circuit 42 (step 722). In this regard, recall that the then current data value in temporary storage 54 corresponds to the immediately previous interpolated value Y2 resulting from the previous stage two-phase one operation.

Stage three-phase two operation may then be implemented by simply releasing the contents of register 206 onto address bus 216, thereby applying the appropriate data point (e.g. data point Z45 corresponding to location 45) to output FIFO 68 (step 724).

In the foregoing process, the final data pair sent to execution unit 42 at the end of phase one processing at each of stages 1–3 is retrieved by selecting one data point from the then current memory, and by selecting the corresponding data point from temporary storage 54 (for stage two and stage three) or from input FIFO 52 (for stage one). The data value retrieved from FIFO 52 or temporary storage 54 is simultaneously sent to execution unit 42, as well as being written into the memory corresponding to the then current filter stage. In this regard, the particular address within the then current memory stage to which the newly retrieved data value is to be written is stored in down-counter register 214. This memory location corresponds to the "oldest" data in a particular memory stage. Moreover, when computation for the then current stage resumes, the starting value for the next initial data pair is stored within one of registers 202–206, depending on the filter stage. In this way, the rolling, inside-out data flow scheme described herein may be implemented using a minimum of components, thereby reducing the size and complexity of filter 10 vis-à-vis classical implementations.

Moreover, the use of registers 202–206 further facilitates the rolling feature implemented by pointer circuit 201. Specifically, after each stage one-phase one operation is executed, the value stored in register 202 is decremented by one (steps 709, 711). Thus, in the foregoing example, the value in register 202 decreases from 23, to 22, to 21 . . . and thereafter down to 4 during successive cycles of stage one-phase one operation. Thereafter, the value in register 202 is reset to 41, whereupon it is decremented back down to 4, reset to 41, and so on. Registers 204 and 206 function in an analogous manner. It can thus be appreciated that the foregoing pointer scheme is more analogous to a circular memory or an endless "belt" of memory, rather than a two-dimensional memory array. Moreover, this rolling feature exhibits substantial computational elegance inasmuch as a particular data value need not be moved within a particular stage's memory once it is written into memory; rather, the rolling, inside-out pointer scheme accomplishes the same result with greatly reduced computational complexity.

In the foregoing description of pointer circuit 201, respective data pairs from the various memory sectors during phase one operation of stages 1–3 were characterized as being applied to execution circuit 42 for processing. The manner in which these data pairs are processed by execution circuit 42 to arrive at an interpolated value in the context of the present invention will now be described.

As discussed above, a single interpolated value IX (i.e., G1) is produced as a result of stage one-phase one operation. Similarly, a single interpolated value IY (i.e., G2 or G6) is produced as a result of stage two-phase one operation, and a single interpolated value IZ (i.e., G3, G4, G7 or G8) is produced as a result of stage three-phase one operation. Moreover, phase one operation for each of stages 1–3 involves adding two data values together, thereafter multiplying the resulting sum by a predetermined coefficient; this process is repeated 19 times (corresponding to a total of 38 data points) during stage one-phase one operation; the summation/multiplication process is repeated 4 times (corresponding to 8 data points) for stage two-phase one operation; and this same process is repeated twice (corresponding to 4 data points) for stage three-phase one operation.

The precise manner in which each data pair "sum" is "multiplied" by a particular coefficient may be carried out in any desired implementation. A particularly preferred method of effecting multiplication involves the use of coefficients characterized as sums of powers of 2. Those skilled in the art will appreciate that, for coefficients expressed as a sum of powers of two, the product of a coefficient and a data pair sum may be effected through a series of shift-and-add operations, the number of shifting operations being determined by the number of terms comprising a particular coefficient. A more detailed discussion of a sums of powers of two implementation may be found in co-pending U.S. patent application Ser. No. 07/889,134, filed May 26, 1992 by Kun Lin and entitled "Method and Apparatus for Implementing a Digital Filter Employing Coefficients Expressed as Sums of 2 to an Integer Power", the entire contents of which are incorporated herein by this reference. For example, an exemplary coefficient C may be expressed as follows:

$$C = F_1 2^{-p_1} + F_2 2^{-p_2} \ldots + F_L 2^{-p_L} \qquad (2)$$

where F=−1, 0, or +1, and each exponent "p" is an integer. For a coefficient C having L terms, a total of L shift-and-add operations will be required to produce the product of C times a particular data pair sum.

The manner in which an interpolated value (e.g. IX, IY, or IZ) is produced for the phase one operation of stage one, two or three in the context of the present invention will now be described.

Referring now to FIG. 6, each channel (e.g., left and right channels) has associated therewith a separate data execution unit 42, which suitably comprises a first data register 80, a data bus 82, an adder 84 having a left input 102 and a right input 104, a second data register 86, an accumulator 88, and a shifter 90 including a shifter control module 91 and a complimenter 93.

An exemplary data pair comprising data words X22 and X23 are summed together and multiplied by an exemplary coefficient C19 as follows. Data word X23 is retrieved from RAM 50 (as discussed above in conjunction with FIG. 7) and loaded onto data bus 82, and initially stored in data register 80. Data word X23 is thereafter loaded onto data bus 82 and gated to left input 102 of adder 84. Data word X23, in first data register 80, is gated to right input 104 of adder 84. Data words X22 and X23 are then added together in adder 84, and the resulting sum X22,23 is stored in first data register 80.

Sum X22,23 is thereafter loaded into shifter 90. Under the control of sequencer 34, coefficient C19 is retrieved from coefficient ROM 51 (FIG. 2). More particularly, the first term of coefficient C19, for example $F_1 2^{-p_1}$, is loaded from coefficient ROM 51 into shifter control module 91. The sign of the coefficient term, corresponding to the value of F in Equation (2), is loaded into complimenter 93. The sign of the coefficient term determines whether the data word within shifter 90, upon being shifted in accordance with the particular coefficient term, will be added to or subtracted from the then current value in accumulator 88, as discussed below.

The data sum within shifter 90 is then shifted the appropriate number of places, as controlled by the integer value of the exponent of the coefficient term resident in control module 91. The value of the shifted data word is then stored in register 86.

The contents of accumulator 88 (currently 0) and the contents of register 86 are then gated to left input 102 and right input 104, respectively, of adder 84, and summed together. The resulting sum is then loaded into accumulator 88.

The next term (if any) comprising coefficient C is then loaded into shift control module 91, and the original data sum (e.g. X22,23) is again loaded from register 80 into shifter 90. The foregoing shifting operation is again performed, with the resulting shifted value being applied (through register 86) to right input 104 of adder 84. The then current contents of accumulator 88 are loaded into left input 102 of adder 84, and a summation is again effected. The resulting sum is again stored in accumulator 88.

The foregoing is repeated L times for each coefficient/data pair, where L corresponds to the number of terms in a particular coefficient. The resulting value in accumulator 88 thus corresponds to the "multiplication" of a particular coefficient times its corresponding data pair.

Moreover, accumulator 88 maintains an ongoing sum of each data pair/product during phase one operation for each filter stage. Accordingly, for stage one-phase one operation, after nineteen data sums are shifted and added by their corresponding coefficients, a resulting interpolated value IX is accumulated in accumulator 88. For stage two-phase one operation, an interpolated value IY is produced by the accumulation of the shifting and adding (multiplication) of four data pairs by their corresponding four coefficients. Similarly, an interpolated value IZ is produced in accumulator 88 after only two shift-and-add operations of a data sum by a corresponding coefficient.

Returning momentarily to FIGS. 9 and 12, interpolated value IX, calculated by data execution unit 42 in accordance with the foregoing method during stage one-phase one operation, is written from accumulator 88 into temporary storage 54 (FIG. 9), whereupon it is subsequently read from temporary storage 54 into the appropriate location in stage two memory 66 during stage two-phase one operation. Similarly, interpolated value IY, calculated by data execution unit 42 in accordance with the foregoing description during stage two-phase one operation is suitably released from accumulator 88 and written into temporary storage 54, whereupon it is read into the appropriate location of stage three memory 64, as discussed in greater detail above in conjunction with FIG. 9. Interpolated value IZ, calculated by data execution unit 42 in accordance with the foregoing description during stage three-phase one operation, is suitably written to output FIFO 68 in accordance with a preferred embodiment of the invention.

Returning to now to FIGS. 1, 2 and 9, the 8× interpolated data written to output FIFO 68 is suitably applied to output data interface 30 and thereafter to noise shaper 11. Noise shaper 11 further oversamples the data, for example by a factor of 6×, and quantizes the data down to a low number of bits, for example on the order of 3 or 4 bits. Thus, noise shaper 11 illustratively outputs a four bit signal at 48 Fs.

The output of noise shaper 11 is suitably applied to PWM module 13, which effectively converts the 48 Fs oversampled digital data to an appropriate analog signal 15 and applies this signal to transducer 16 to effect analog audio reproduction of the oversampled signal.

If desired, various other processing steps may be effected by filter 10 as the data moves from input FIFO 54 to output FIFO 68.

For example, the data may be attenuated at any desirable point (i.e., before stage one, after stage one, after stage two or after stage three) within the processing scheme set forth in FIG. 12. In this context, the term "digital attenuation" refers to the predetermined reduction in amplitude of the data in accordance with a user controlled variable, most typically the volume control input (not shown) associated with control panel 46 (FIG. 2). The attenuation function may also be employed as a soft mute feature, whereby the amplitude of the data applied to output transducer 16 and, hence, the volume of the resulting audio signal, may be rapidly ramped up or down, as appropriate, when the audio unit is turned off and on or when the mute feature is employed to temporarily mute and/or reestablish the audio signal to remove annoying "pops" or "clicks".

Figure 13:
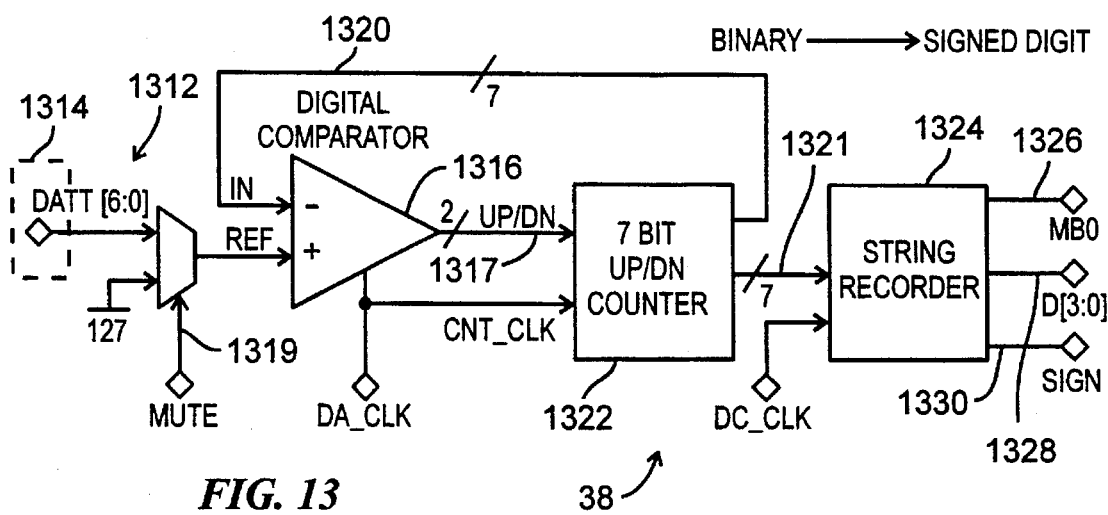
FIG. 13 is a schematic diagram of the attenuation level generator of the digital attenuator of FIG. 2A.

Referring now to FIG. 13, each channel (e.g., left and right channels) suitably has associated an exemplary digital attenuator circuit 38 (see control subsystem 20; FIG. 1) comprising an input module 1312, including an attenuation register 1314, configured to generate a reference signal 1318; a digital comparator 1316; an up/down counter 1322 (configured to generate a feedback signal 1320 and a control signal 1321); a string recoder 1324; and respective output pins 1326, 1328, and 1330.

Input module 1312 is suitably configured to apply reference signal 1318 to digital comparator 1316 in accordance with the current value of the contents of digital attenuator register 1314. More particularly, register 1314 cooperates with control panel 46 such that the digital value within register 1314 corresponds to the position of a user actuated volume control (not shown), for example a rotating or sliding knob. Alternatively, reference signal 1318 may be controlled by a mute signal from mute control 1319, for example a conventional spring loaded, user depressible mute button (not shown) and/or an on-off power control button (not shown).

Reference signal 1318 is applied to digital comparator 1316. Digital comparator 1316 compares the value of reference signal 1318 to the value of feedback signal 1320, and generates a control signal 1317 as a function of the difference therebetween.

Up/down counter 1322 is illustratively configured to apply control signal 1321, suitably equal in value to feedback signal 1320, to string recoder module 1324. Up/down counter 1322 varies the magnitude of control signal 1321 in accordance with the magnitude of control signal 1317. Accordingly, it can be seen that control signal 1317 is selectively varied up and down, in accordance with the difference between feedback signal 1320 and reference signal 1318, to thereby drive the magnitude of control signal 1321 to match the value of reference signal 1318. In addition, the rate at which control signal 1317 and control signal 1321 are permitted to vary is limited by the rate at which digital comparator 1316 and up/down counter 1322 are clocked, respectively. In this way, the value of control signal 1321 is controllably ramped up and down, thereby tending to smooth out sharp changes in amplitude.

In the illustrated embodiment, control signal 1321 comprises a stream of seven bit parallel data words indicative of the user controlled volume level for the audio signal output by transducer 16 (FIG. 1). In accordance with one aspect of the present invention, recoder 1324 converts the 7-bit control signal 1321 into an attenuation coefficient $C_A$ of a predetermined form. In a preferred embodiment, attenuation coefficient $C_A$ takes the form of a four term sum of 2 to an integer power, much like the coefficient C expressed in Equation (2), discussed above in conjunction with FIG. 6. However, for purposes of attenuator circuit 38, attenuation coefficient $C_A$ may be conveniently expressed as $$C_A = F_1 C_1 + F_2 C_2 + F_3 C_3 + F_4 C_4 \quad (3)$$

where $F_1$–$F_4$=−1, 0, or 1, and further wherein $C_1$–$C_4$ each correspond to the number 2 to an integer power. In this way, the 7-bit attenuation coefficient comprising control signal 1321 may be conveniently expressed as a four term sum of 2 to an integer power. A 7-bit attenuation value corresponds to 127 different attenuation levels, each of which may be expressed by a maximum of four powers of 2 terms. Thus, one or more of $F_1$–$F_4$ may equal zero.

The output of recoder 1324 comprises an auto zero signal at pin 1326, a coefficient signal at pin 1328, and a sign signal at pin 1330. The auto zero signal (pin 1326) corresponds to mute signal 1319; that is, rather than attempt to drive the coefficient signal (pin 1328) to a true zero state during a power off or a mute condition, it is operationally more efficient to employ a mute signal (pin 1326) to effect a zero attenuation value (this is discussed in greater detail below).

Referring now to FIGS. 6 and 12–13, the digital audio data processed by filter 10 may be attenuated at any desirable stage (see FIG. 12) within the filtering process. From a strictly computational standpoint, it is generally desirable to attenuate the data at very early stages, for example, prior to entering either the stage 1 or stage 2 filter. In this way, a relatively small number of data points are required to be attenuated. For example, if the data is attenuated after the stage 1 filter, the number of data points which must be separately attenuated is equal to 2 times the number of data points retrieved from ROM 12, inasmuch as the first stage filter performs a 2× interpolation on data retrieved from ROM 12. However, if the data is attenuated after the stage two filter, four times as many data points as were retrieved from ROM 12 need to be attenuated inasmuch as the second stage filter also performs an additional 2× interpolation.

On the other hand, substantially less quantization noise is introduced by the attenuation process if the data is attenuated at higher filtering stages. In a preferred embodiment of the present invention, the data are suitably attenuated following the stage two operation.

With particular reference to FIGS. 6 and 13, each interpolated data point IY calculated in accordance with stage two-phase one (or "passed through" in stage two-phase two) operation is desirably loaded into shifter 90 and shifted in accordance with attenuation coefficient $C_A$ to effect the attenuation of the audio data. More particularly, each data point to be attenuated is suitably stored in data register 80, from which it is loaded into shifter 90. The first of four terms (e.g., C1) comprising attenuation coefficient $C_A$ from coefficient signal 1328 (FIG. 13) is then applied to shift control module 91 associated with shifter 90, and that term's "F" sign coefficient is loaded into sign control module 93. The data value resident in shifter 90 is shifted in accordance with the first term of the attenuation coefficient.

The shifted value is output from shifter 90 and, after passing through data register 86, loaded into input 104 of adder 84. Since this is the first term of the attenuation coefficient, it is added to a value of zero resident in left input 102 of adder 84, and the sum stored in accumulator 88. The original (unshifted) data value is again loaded from data register 80 into shifter 90, whereupon it is shifted a predetermined number of times in accordance with the second term (C2) comprising the attenuation coefficient. The shifted result is then loaded into data register 86 and thereafter into right input 104 of adder 84; the data value previously shifted in accordance with the first term (C1) is released from accumulator 88 and loaded into left input 102 of adder 84. The contents of left input 102 and right input 104 are then added together, and the sum stored in accumulator 88.

The foregoing process is repeated four times (once for each of the four terms comprising coefficient $C_A$) resulting in the "product" of $C_A$ and the data word. The product is released from accumulator 88, through a data link 89, and thereafter written into temporary storage 54 (if the data value corresponds to a stage two-phase one calculation) or directly into stage 3 memory (if the data value corresponds to a stage two-phase two operation).

In a preferred embodiment of the present invention wherein multiplierless shift-and-add "multiplication" is employed, it is desirable to recode the 7-bit attenuation coefficient (signal 1321) into a sum of four 4-bit terms as set forth in Equation (3). In accordance with a particularly preferred embodiment, a technique known as "overlapped multiple-bit scanning" is conveniently employed by string recoder 1324 to convert the 7-bit attenuation coefficient into four terms, each comprising four bits. See Hwang, *Computer Arithmetic Principles, Architecture, and Design*, John Wiley and Sons, New York.

More particularly, string recoder 1324 preferably employs a technique wherein the seven bits comprising the original attenuation coefficient are scanned in groups of three ("triplets") in a sequential but overlapping manner, wherein bits 1–3 correspond to term C1 in Equation (3), bits 3–5 correspond to term C2, bits 5–7 correspond to C3, and bits 6–8 correspond to coefficient term C4. (A "dummy" eighth bit is suitably employed to ensure that each triplet comprises three bits.)

Figure 14:
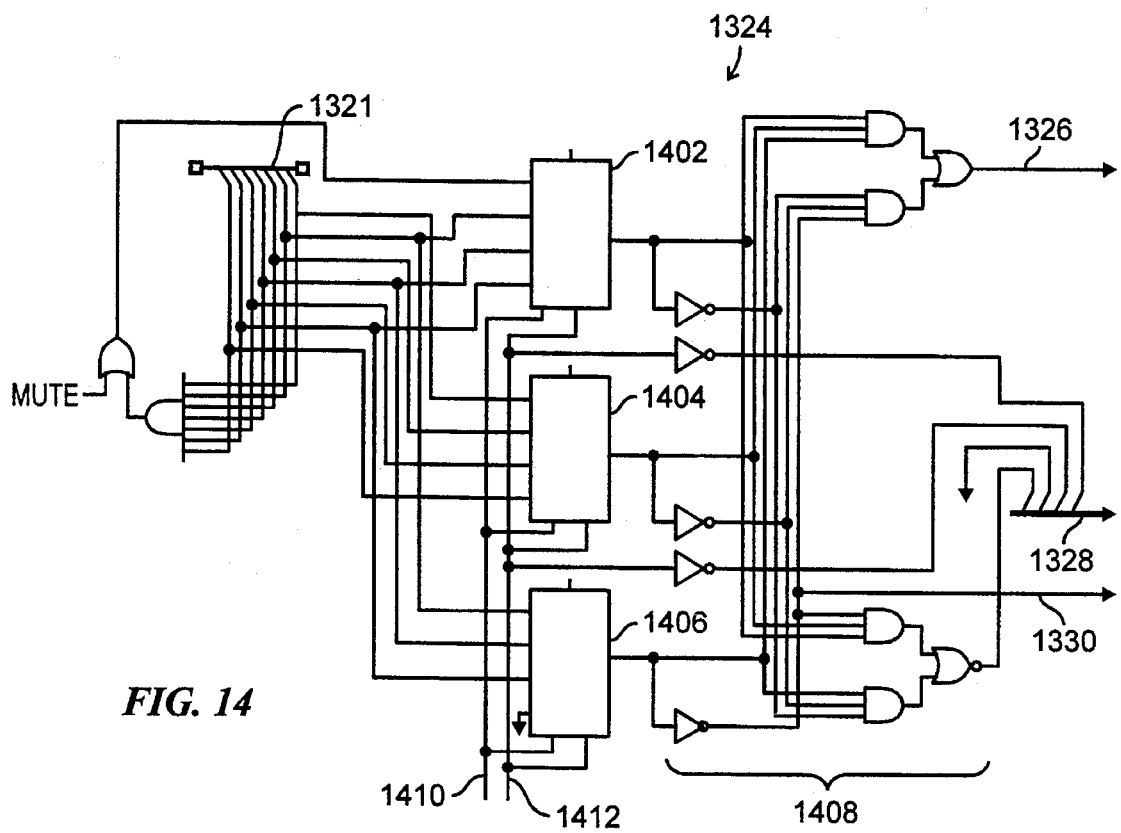
FIG. 14 is a schematic diagram of the recoder unit of the digital attenuator of FIG. 13.

With momentary reference to FIG. 14, string recoder 1324 suitably comprises various digital logic components arranged to effect the foregoing scanning scheme. In particular, recoder 1324 comprises respective 4-to-1 multiplexers 1402, 1404, and 1406, and a digital logic array 1408. Respective select lines 1410 and 1412 are configured to control the operation of multiplexers 1402–1406.

More particularly, control signal 1321, comprising a 7-bit parallel signal, is applied to respective multiplexers 1402–1406. Select lines 1410 and 1412 are suitably configured to generate coefficient terms C1–C4 as follows:

| SELECT Line 1410 | SELECT Line 1412 | COEFFICIENT TERM |
|---|---|---|
| 0 | 0 | C1 |
| 0 | 1 | C2 |
| 1 | 0 | C3 |
| 1 | 1 | C4 |

The outputs of multiplexers 1402–1406 are suitably configured to cooperate with logic array 1408 to effect a desired recoding scheme, for example the overlapping triplet scanning scheme discussed above. By appropriately configuring various components comprising logic array 1408, each of the four coefficient terms set forth in Equation (3) may be fully defined.

More particularly, the four bits which define the magnitude of a particular coefficient term C1–C4 are output at pin 1328. The value of the factor F (F=0, –1, or +1) corresponding to each coefficient term are defined by the outputs at zero pin 1326 and sign pin 1330 as follows:

| PIN 1326 | PIN 1330 | F |
|---|---|---|
| 0 | 0 | 0 |
| 0 | 1 | 0 |
| 1 | 0 | –1 |
| 1 | 1 | +1 |

While the foregoing attenuator circuit has been described in the context of a 7-bit attenuation signal recoded into a sum of four 4-bit terms, a coefficient of virtually any bit length may be suitably recoded using any desired recoding scheme to produce a recoded version of the original coefficient in any suitable format.

Output signal 1328 from recoder 1324 corresponds to the four term, sum of powers of two attenuation coefficient $C_A$ discussed above in connection with FIGS. 6 and 13.

In accordance with the foregoing attenuation scheme, audio data are attenuated in accordance with the position of the user controlled volume (or mute) control, in a manner which is linear in magnitude. The foregoing general scheme may be augmented to effect attenuation which is linear in dB if desired. Moreover, the illustrated seven bit control signal yields 127 possible attenuation levels corresponding to 127 different volume levels. The control signal, however, may comprise any number of bits (corresponding to any desired level of resolution in the volume control); the foregoing recoding scheme may accommodate such variable bit control signals by simply generating a sum of powers of 2 having a sufficient number of terms to adequately define the number of desired attenuation levels.

The foregoing attenuation scheme provides considerable operational efficiencies over existing systems. For example, existing systems typically employ a hardware multiplier to simply multiply each data value by a seven bit attenuation coefficient. In the multiplierless architecture discussed herein, such "multiplication" is effected by the shift and add scheme discussed above in conjunction with FIG. 6, yet may be accomplished in four clock cycles (corresponding to four shift and add operations; one operation per attenuation coefficient term).

Referring now to FIG. 6, adder 84 comprises a conventional adder in accordance with a preferred embodiment of the invention. In an alternate preferred embodiment, adder 84 may comprise a "fast adder" configured to execute binary addition in the following manner.

Figure 16A:
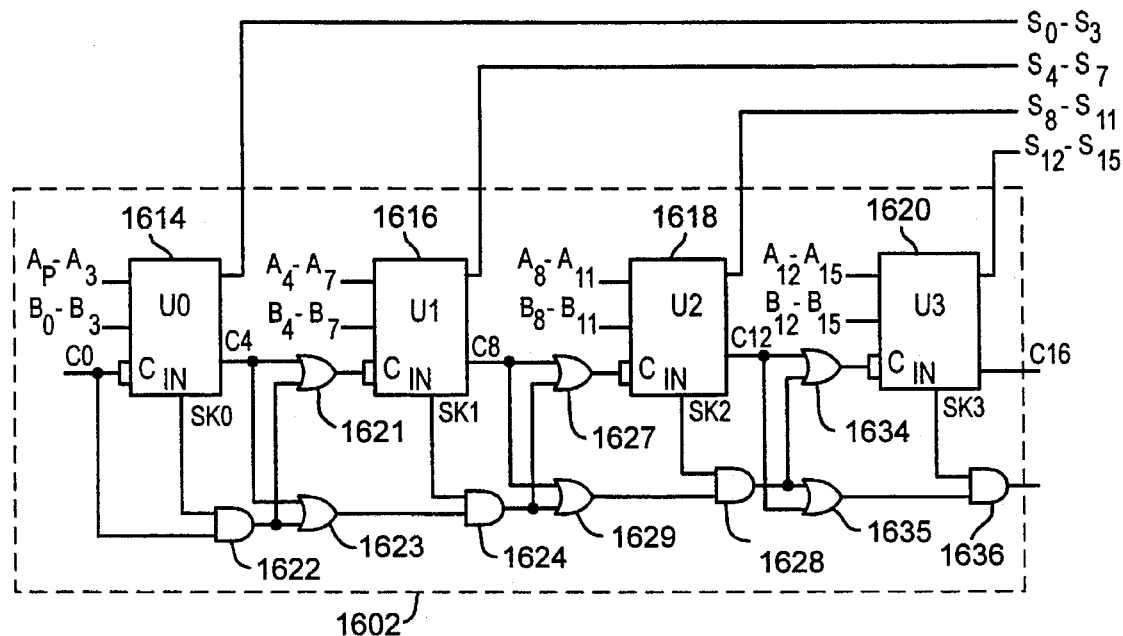
FIG. 16A is a block diagram of a digital adder in accordance with the present invention, showing four 4-bit adders cascaded together.

Referring now to FIG. 16A, adder 84 (FIG. 6) for use in data execution unit 42 suitably comprises a multi-stage adder 1602 employing cascaded architecture which may be conveniently configured to accommodate the addition of binary words having any desired length. Adder 1602 suitably includes a predetermined number (e.g. 4) of adder modules, each adder module effecting addition of a respective predetermined slice (bits) of the binary words being added. The respective adder modules may, but do not necessarily operate upon slices of the same size. The combination of slice sizes to provide system performance may be determined in accordance with conventional techniques in the example shown in FIGS. 16A–B, a series of four 4-bit adders 1644–1620 are cascaded to effect the addition of two 16-bit words.

Adder 1602 suitably comprises respective 4-bit adders 1614, 1616, 1618, and 1620, respective OR gates 1621, 1623, 1627, 1629, 1634 and 1635, and respective AND gates 1622, 1624, 1628, and 1636. Adder 1602 thus functions to add an exemplary 16-bit word A and exemplary 16-bit word B to compute a 16-bit sum S, as well as a carry bit $C_{16}$.

More particularly, 4-bit adder 1614 computes the sum $S_0$–$S_3$ of bits $A_0$–$A_3$ of data word A and bits $B_0$–$B_3$ of data word B. Similarly, 4-bit adder 1616 computes the sum $S_4$–$S_7$ of bits $A_4$–$A_7$ and bits $B_4$–$B_7$; 4-bit adder 1618 computes the sum $S_8$–$S_{11}$ of bits $A_8$–$A_{11}$ and bits $B_8$–$B_{11}$; and 4-bit adder 1620 computes the sum $S_{12}$–$S_{15}$ of bits $A_{12}$–$A_{15}$ and bits $B_{12}$–$B_{15}$. In addition, respective 4-bit adders 1614–1620 are also configured to compute respective carry bits C4, C8, C12, and C16, as appropriate.

Figure 16B:
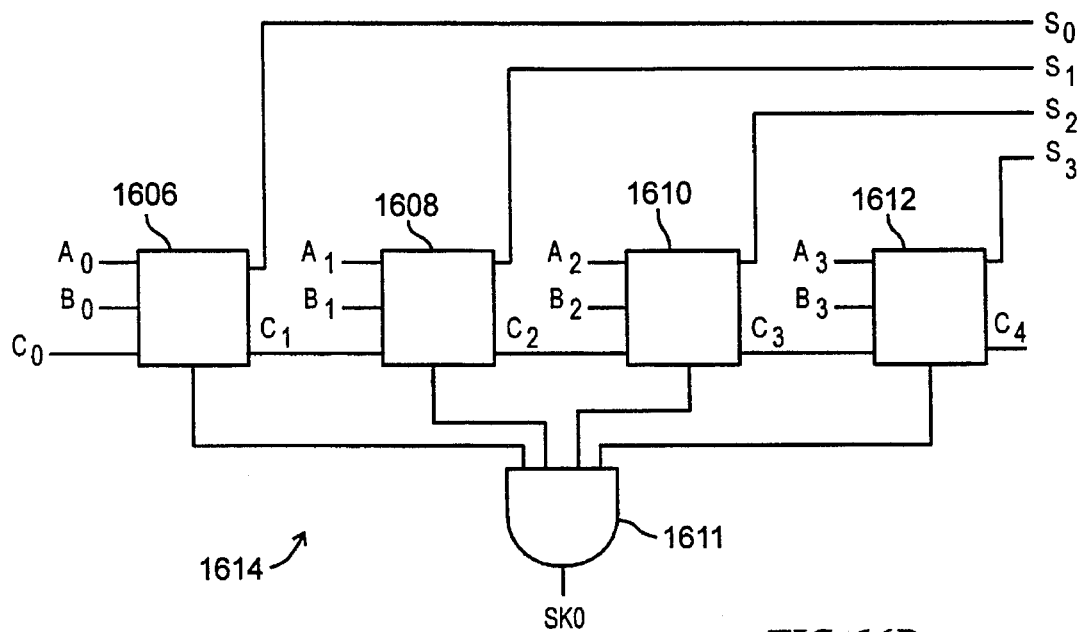
FIG. 16B is a block diagram of one of the 4-bit adders of FIG. 16A.

With momentary reference to FIG. 16B, each 4-bit adder (e.g., 4-bit adder 1614) suitably comprises respective 1-bit adders 1606, 1608, 1610, and 1612. 1-bit adder 1606 is configured to compute the sum $S_0$ of bits $A_0$ and $B_0$, as well as a carry bit $C_1$. Similarly, 1-bit adder 1608 is configured to compute the sum $S_1$ of bits $A_1$ and $B_1$, as well as a carry bit $C_2$, and so on. Classically, 1-bit adders 1606–1612 embody logic for effecting the addition of two bits and generating a 2-bit output as a function thereof, namely a sum bit S (least significant bit) and a carry bit C (most significant bit).

Referring again to FIG. 16A, in the classical implementation of cascaded 4-bit adders, the carry bit generated by each adder stage (if one is generated at all) is applied to the carry input of the next succeeding stage. Thus, classical implementation suggests that carry bit $C_4$, if generated by 4-bit adder 1614, would be directly applied to the carry input $C_{IN}$ of adder 1616, and that the carry bit $C_8$, if generated by adder 1616, would be directly applied to the carry input $C_{IN}$ of adder 1618, and so on.

In order to avoid the propagation delays associated with the foregoing implementation, the carry bit generated by a 4-bit adder may be permitted to bypass the next succeeding adder under certain circumstances. One manner of implementing this is the well-known Manchester architecture.

In particular, referring again to FIG. 16B, respective 1-bit adders 1606–1612 may be configured to generate a propagate bit $P_i$ which represents the EXCLUSIVE-OR function of respective operand bits $A_i$ and $B_i$. A 4-input AND gate 1611, receptive of the propagate bit from each of 1-bit adders 1606–1612, is suitably added to the 4-bit adder module to generate a skip signal $SK_0$, indicative of the bit-wise EXCLUSIVE-OR function of the input bit slices; a skip bit $SK_i$ is generated by each 4-bit adder for which all propagate bits P of the component 1-bit adders are true.

Referring again to FIG. 16A, 4-bit adders 1614, 1616, 1618 and 1620 generate skip outputs $SK_0$, $SK_1$, $SK_2$ and $SK_3$ respectively. Of course, if a particular 4-bit adder generates a skip bit (indicating that each of its respective propagate bits are true), the 4-bit adder would only generate a carry bit if it received a true carry bit at its $C_{in}$. Similarly, a 4-bit adder which generates a carry bit from its operands A and B may not also generate a skip bit during a particular cycle.

If a particular adder generates a logical true skip bit, a carry bit which would otherwise be applied to its carry input $C_{IN}$ is permitted to "skip" ahead to succeeding adders and be applied to the first adder in sequence which does not generate a logical true skip bit. In this way, the propagation delay associated with propagating the carry bit through successive adder stages may be reduced, to the extent appropriate. Exemplary schemes for applying a carry bit to the carry input $C_{IN}$ of an immediately successive adder stage will now be described.

More particularly, carry bit $C_4$ generated by adder 1614 may be applied directly to the carry input $C_{IN}$ of adder 1616 through OR gate 1621. Alternatively, carry bit $C_4$ may be applied to carry input pin $C_{IN}$ of adder 1618 if adder 1616 produces a skip bit. In particular, the $C_4$ output from adder 1614 may be logically OR-ed at OR gate 1623 with a previous carry bit $C_0$, AND-ed with the skip output $SK_1$ from adder 1616, and the output applied directly (through OR gate 1627) to the carry input $C_{IN}$ of adder 1618. Moreover, if adder 1618 also produces a logical true carry skip bit $SK_2$, carry output $C_4$ from adder 1614 may skip both adders 1616 and 1618, and be applied directly (through OR gate 1634) to the carry input of adder 1620. For a cascaded adder of the form shown in FIG. 16A, each carry bit generated by a particular adder stage may continue to bypass succeeding adder stages so long as each successive adder stage also produces a logical true skip bit.

Thus, the propagation delay entailed in passing the carry bit through successive outer stages 1614–1620 is reduced. However, propagation delays associated with the gating logic will be incurred. For example, carry bit $C_0$ would be applied to the carry input $C_{IN}$ of adder 1620 if each of the lower order adders 1614, 1616, and 1618 each generates a carry-skip signal (i.e., $SK_0$, $SK_1$, and $SK_2$ are all true). In that case, carry bit $C_0$ will propagate through gates 1622, 1623, 1624, 1629, 1628 and 1634 to the carry input $C_{IN}$ of adder 1620. A total of 6 gate delays is thus incurred.

The present inventors have determined that the propagation delay associated with the foregoing Manchester architecture may be further reduced by permitting a carry bit to skip ahead to the first successive adder stage which does not produce a logical true skip bit, yet without having to pass through the intervening gates associated with the "skipped" adder stages. Moreover, by appropriately configuring the logic necessary to determine which downstream adder is to receive the carry bit, propagation delays may optimally be reduced to the delays associated with only those gates required to determine the appropriate adder stage to which a particular carry bit is to be applied.

Figure 16C:
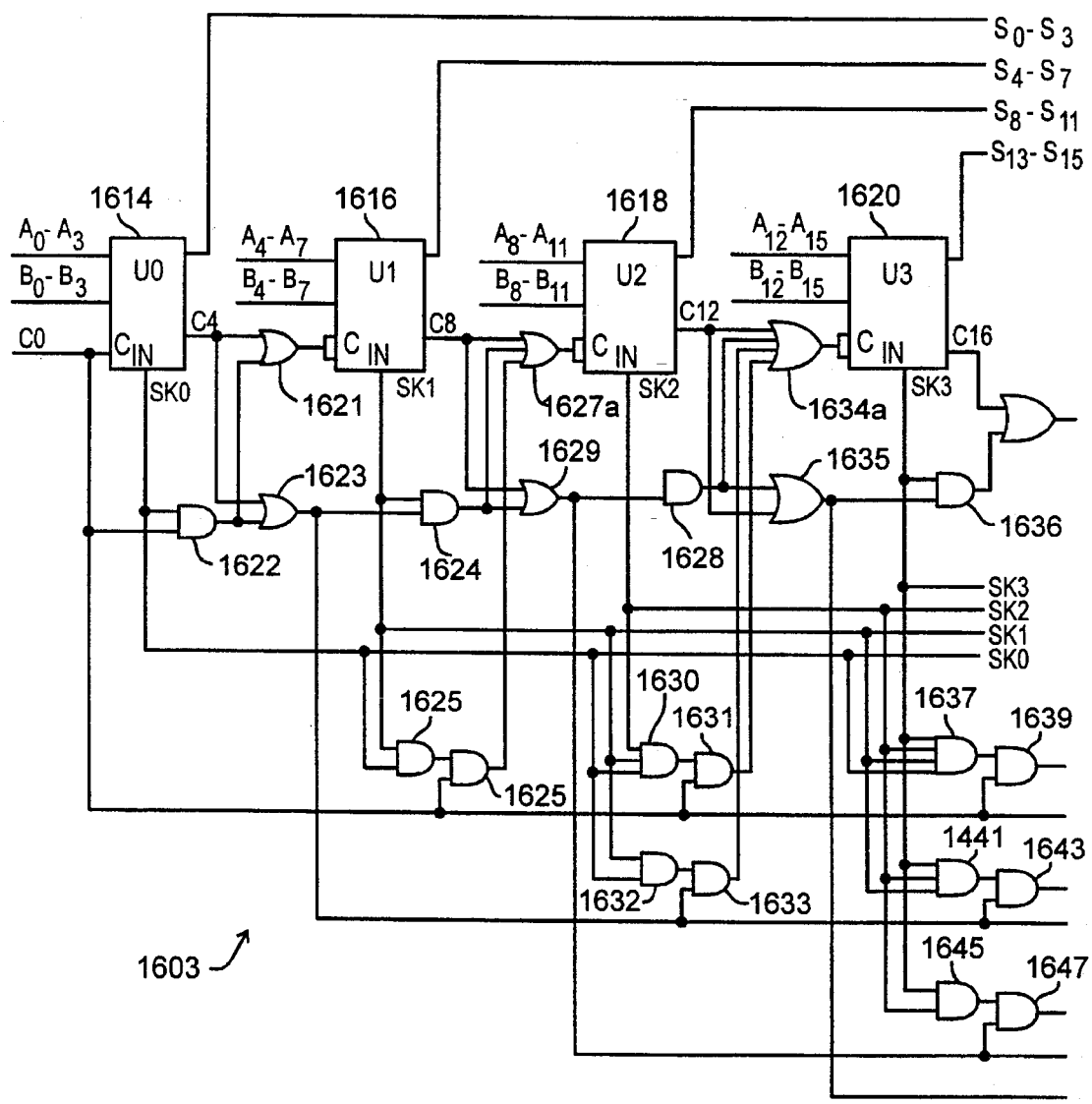
FIG. 16C is a block diagram of the adder shown in FIG. 16A, showing additional fast adder carry skip circuitry.

Specifically, referring to FIG. 16C, logic is provided to gate a carry input to the first adder not generating a logic high skip output, bypassing all intervening adder stages, while incurring a minimum of gate delays. More specifically, appropriate gating logic is added to the Manchester architecture of FIG. 16A to reduce the propagation delay: respective pairs of AND gates 1625 and 1626, 1630 and 1631, 1632 and 1633, 1637 and 1639, 1641 and 1643, and 1645 and 1647. One AND gate of each pair generates a gating signal indicative of all intervening skip carry outputs being at logic high (AND gates 1625, 1630, 1632, 1637, 1641, 1645) and the second AND gate (1626, 1631, 1633, 1639, 1643, 1647) is receptive of the gating signal and the carry bit at issue for selectively gating the carry bit two a higher order adder. For example, if a carry bit $C_0$ is provided at the carry input of adder 1614, and the skip carry output ($SK_0$, $SK_1$, $SK_2$) of each of adders 1614, 1616, and 1618 are high, AND gate 1630 will generate a logic high gating signal to gate 1631, and carry bit $C_0$ will be gated through AND gate 1631 and OR gate 1634A to the carry input of adder 1620. Carry bit $C_0$ is thus available at carry input $C_{IN}$ of adder 1620 after only two gate delays (AND gate 1631 and OR gate 1634A).

Thus, lower order carry bits are presented to any higher order adder stage incurring a maximum of three gate delays, so long as all intervening adders generate a logic high carry skip signal $SK_i$. Consequently, the propagation delay typically associated with cascaded adders is greatly reduced.

Although the invention has been described herein in conjunction with the appended drawing figures, those skilled in the art will appreciate that the scope of the invention is not so limited. Various modifications in the selection and arrangement of the various components in method steps discussed herein may be made without departing from the spirit of the invention as set forth in the appended claims.

We claim:

1. A digital signal processor (DSP) circuit for recursively retrieving and processing pairs of data points in a symmetric digital filter, comprising:

first means for selecting an initial address within a sequentially addressed memory array and for storing indicia of said initial address in an address storage register;

second means for applying a data point corresponding to said initial address to an adder circuit;

third means for applying indicia of said initial address to an up counter and to a down counter;

fourth means for decrementing said down counter to produce a first down counter address;

fifth means for applying a data point corresponding to said first down counter address to said adder circuit for summation with said data point corresponding to said initial address;

sixth means for writing indicia of said first down counter address over said indicia of said initial address in said address storage register;

seventh means for incrementing said up counter to generate a subsequent up counter address, and decrementing said down counter to generate a subsequent down counter address; and eighth means for applying the respective data points corresponding to said subsequent up counter address and said subsequent down counter address to said adder circuit;

wherein said seventh and eighth means are configured to sequentially increment said up counter, decrement said down counter, and apply a pair of data points corresponding to said up counter and said down counter outputs, respectively, to said adder circuit.

* * * * *